(12) United States Patent
Moslehi et al.

(10) Patent No.: US 8,853,521 B2
(45) Date of Patent: *Oct. 7, 2014

(54) TRUNCATED PYRAMID STRUCTURES FOR SEE-THROUGH SOLAR CELLS

(75) Inventors: Mehrdad Moslehi, Los Altos, CA (US); David Xuan-Qi Wang, Fremont, CA (US)

(73) Assignee: Solexel, Inc., Milpitas, CA (US)

(*) Notice: Subject to any disclaimer, the term of this patent is extended or adjusted under 35 U.S.C. 154(b) by 683 days.

This patent is subject to a terminal disclaimer.

(21) Appl. No.: 13/193,302

(22) Filed: Jul. 28, 2011

(65) Prior Publication Data

US 2012/0021560 A1    Jan. 26, 2012

Related U.S. Application Data

(63) Continuation-in-part of application No. 12/626,778, filed on Nov. 27, 2009, now Pat. No. 8,053,665, and a continuation-in-part of application No. 11/868,493, filed on Oct. 6, 2007, now Pat. No. 8,035,028.

(60) Provisional application No. 61/118,243, filed on Nov. 26, 2008.

(51) Int. Cl.
*H01L 31/18* (2006.01)
*H01L 31/0352* (2006.01)
*H01L 31/04* (2014.01)

(52) U.S. Cl.
CPC ........ *H01L 31/0352* (2013.01); *H01L 31/1892* (2013.01); *H01L 31/035281* (2013.01); *Y02E 10/547* (2013.01); *H01L 31/1804* (2013.01); *H01L 31/04* (2013.01)
USPC ............... 136/244; 136/252; 438/57; 438/71; 438/73; 438/96; 438/97; 257/E21.002

(58) Field of Classification Search
CPC ................... H01L 31/0352; H01L 31/035281; H01L 31/1804; H01L 31/1892; H01L 31/04
See application file for complete search history.

(56) References Cited

U.S. PATENT DOCUMENTS 6,645,833 B2 * 11/2003 Brendel ........................ 438/458

* cited by examiner

*Primary Examiner* — Jeffrey T Barton
*Assistant Examiner* — Edward Schmiedel

(57) ABSTRACT

The present disclosure presents a partially-transparent (see-through) three-dimensional thin film solar cell (3-D TFSC) substrate. The substrate includes a plurality of unit cells. Each unit cell structure has the shape of a truncated pyramid, and its parameters may be varied to allow a desired portion of sunlight to pass through.

10 Claims, 41 Drawing Sheets

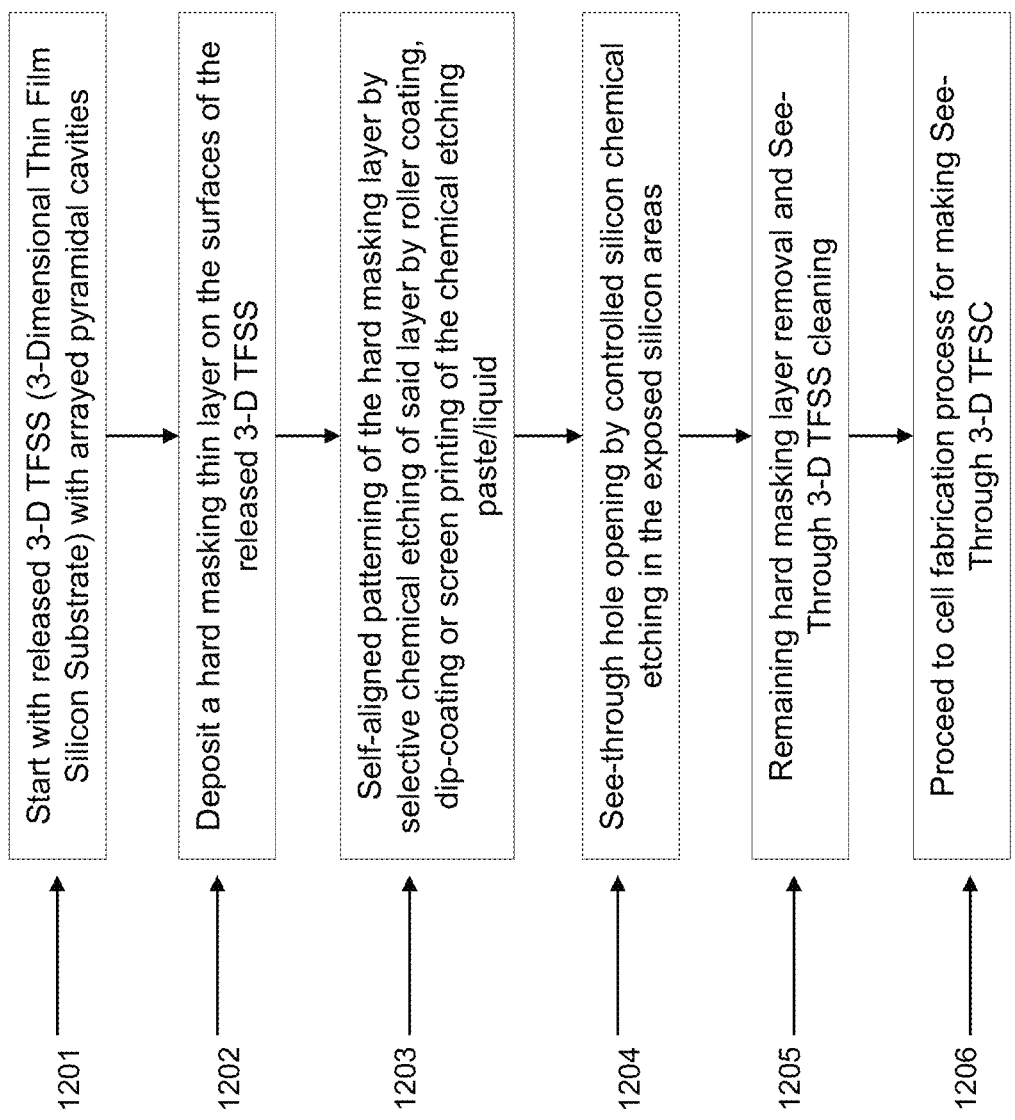

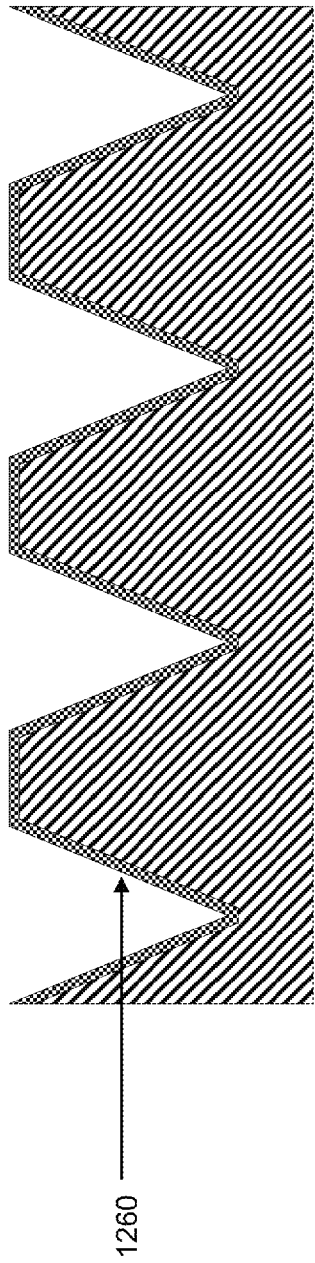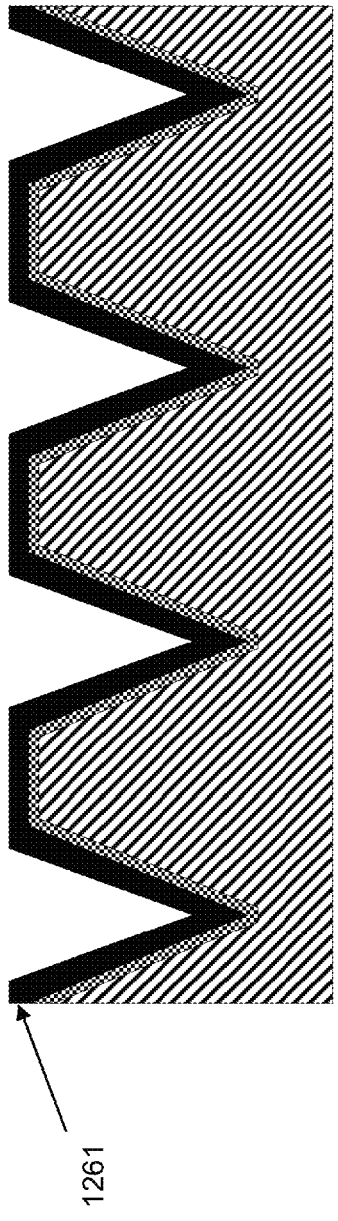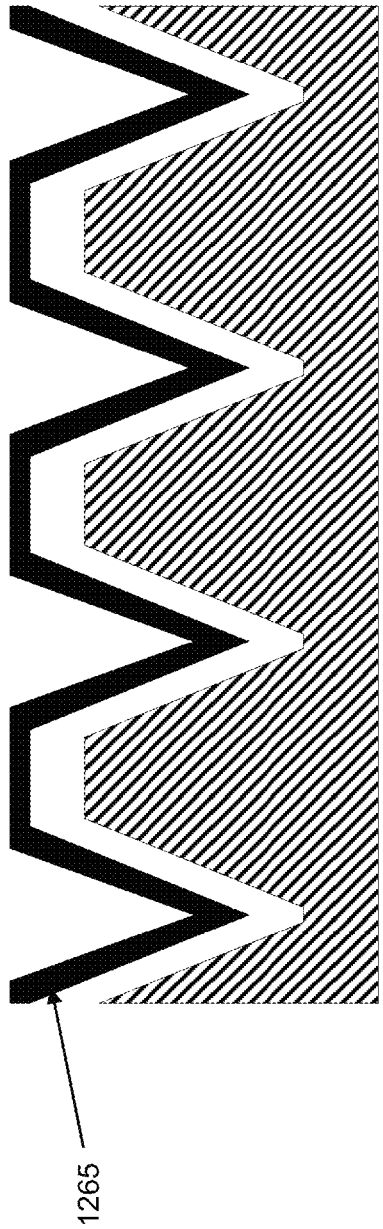

TRUNCATED PYRAMID STRUCTURES FOR SEE-THROUGH SOLAR CELLS

CROSS-REFERENCE TO RELATED APPLICATIONS

This application is a continuation-in-part of U.S. patent application Ser. No. 12/626,778 and U.S. patent application Ser. No. 11/868,493, both of which are incorporated by reference in their entirety herein.

FIELD

This disclosure relates in general to the field of solar cells and solar cell manufacturing. Particularly, the disclosure relates to enhanced three-dimensional thin-film or crystalline-film solar cells (3-D TFSCs) and methods of manufacturing the same. Even more specifically, this disclosure relates to structural designs and methods of manufacturing aesthetically appealing, three-dimensional partially-transparent (see-through) TFSCs with relatively high conversion efficiencies and substantially uniform light transmissivities. This disclosure is applicable to building-integrated photovoltaics (BIPV) applications including power-generating solar glass as well as other solar photovoltaic power modules.

BACKGROUND

Three-dimensional thin film solar cell substrates afford cost, performance, and mechanical strength advantages. Compared to traditional flat solar cells with a similar amount of silicon, 3-D TFSCs have superior mechanical strength, better light trapping, and lower cell processing costs because of their self-aligned nature.

BIPV involves the process of integrating electricity-producing photovoltaic technology into residential, commercial, and industrial building and construction designs and materials. With BIPV, the solar electricity-producing components actually become an integral part of the building or construction materials and design, often serving as the protective exterior weathering skin and/or interior building components. Semi-transparent or see-through solar PV modules comprise the most attractive segment of BIPV applications. These modules can be used in many applications including window glazing in building windows. In some applications they are also a part of shading devices such as car parking covers. Such BIPV systems are also known as "shadow-voltaic" systems. See-through BIPV modules can be also part of energy efficient glazing, where they are used instead of usual glass.

Currently, about 80% of the BIPV applications are served by crystalline silicon cell technology, while inorganic thin-film (TF) technologies account for the remaining 20% of the total BIPV market. However, the TF technologies are projected to capture over 50% of the BIPV applications by 2015. The TF technologies include amorphous silicon (a-Si), cadmium telluride (CdTe), copper-indium-gallium-diselenide (CIGS), and organic PV (OPV). Among them, CdTe and CIGS promise higher efficiencies than a-Si. However, these TF technologies in practice offer efficiencies in the range of 5% to 12%, with the TF see-through BIPV module efficiencies being essentially limited to the single-digit efficiency range of 4% to 8%. Both OPV and dye-sensitized solar cells (DSSC) are considered to be the third generation BIPV technologies (both currently providing module efficiencies on the order of 6%). All the TF and DSSC BIPV technologies currently offer much lower efficiencies than crystalline silicon BIPV. However, the TF technologies provide better aesthetics than crystalline silicon, particularly for see-through BIPV module applications. In a typical see-through crystalline silicon BIPV module for solar glass applications, the crystalline silicon cells are spaced apart to allow for visible light transmission in between the tiled cells. While these see-through crystalline silicon PV modules can provide relatively high effective efficiencies (e.g., typically in the range of 10% to 12%), they do not offer very attractive aesthetics, both due to the tiled design and also due to the standard busbar emitter interconnects in the cells (which may show visible metallization fingers and busbars).

DSSCs operate based on the interaction between light and a dye coated onto small grains of titanium dioxide. The grains are placed in a liquid that acts as an electrolyte, collecting the electrons released by the dye as it absorbs light, thus generating current. The whole mixture is sandwiched between a transparent glass sheet electrode doped with tin oxide to make it electrically conductive, and a rear panel. The efficiency of DSSCs designed for outdoor conditions is currently about 6%. This is far below the efficiency of standard crystalline silicon BIPV modules.

OPV and DSSC BIPV modules cannot easily compete with the conventional crystalline silicon or TF BIPV solar panels due to their relatively low conversion efficiencies and shorter operational lifetimes. Crystalline silicon solar cells and modules have proven long lifetimes in excess of 25-30 years in the field, and no TF or DSSC technology can offer or match such a track record. While the conventional crystalline silicon wafer BIPV is suitable only for rigid BIPV applications, the TF and DSSC BIPV modules can be used for both rigid and flexible substrate applications.

SUMMARY

Reference is now made to co-pending U.S. Pub. No. 2008/0295887, entitled "THREE-DIMENSIONAL THIN-FILM SOLAR CELLS," (the '887 publication) which has a common inventor with the present disclosure and which is hereby incorporated by reference in its entirety.

The '887 publication disclosed methods for manufacturing a 3-D TFSC. The methods comprise using a silicon substrate template to form the 3-D thin film silicon substrate (3-D TFSS). The template comprises a plurality of posts and a plurality of trenches between the plurality of posts. The 3-D TFSS is made by forming a sacrificial layer on the template, subsequently depositing a semiconductor layer, selectively etching the sacrificial layer, and releasing the semiconductor layer from the template. More specifically, the semiconductor layer is a self-supporting, free-standing three-dimensional (3-D) epitaxial silicon thin film deposited on and released from a low-cost reusable crystalline silicon substrate template. The reusable silicon template may be reused to form 3-D films numerous times before being reconditioned or recycled. The template may be patterned with a three-dimensional topography comprising various structural surface topography features, which may be imparted to the substrate via the processes disclosed herein.

The present disclosure includes a method for manufacturing a 3-D TFSS with truncated-pyramid shaped unit cells for making partially transparent solar cells. The use of discrete and isolated inverted pyramidal cavities with tapered sidewalls enables the advantageous features of this disclosure. In one embodiment, the pyramidal cavities have central axes substantially perpendicular to the light capturing surface of the substrate, and they may have an aspect ratio of height to side dimension of approximately 0.5 to 5, or in some embodiments 1.5 to 3. An aspect ratio may also be expressed as the ratio between pyramidal height and diagonal dimension, which may vary based on the particular geometrical shape of the pyramidal cavity, but may also be in the ranges of 0.5 to 5, or 1.5 to 3. The 3-D see-through TFSS is also a contiguous, free standing, self-supporting film that is released/separated from a reusable silicon template, which comprises a plurality of truncated pyramid structures or cavities. The reusable silicon template may be reused to form 3-D TFSCs numerous times before being recycled.

The 3-D TFSCs of this disclosure can be made to be relatively rigid, semi-rigid, or flexible depending on the 3-D TFSS design parameters. This disclosure allows the production of free-standing, self-supporting three-dimensional monocrystalline silicon thin-film solar cells with sufficient mechanical rigidity and resilience for reduced cell breakage in the solar cell production factory. This structural design and fabrication process results in substantially reduced silicon consumption and PV manufacturing cost. In addition, compared to other flat, thin-film (TF) crystalline Si approaches, the present disclosure may offer the following advantages: (i) conventional surface texturing of flat, thin film, Si to reduce reflectance losses requires a minimum film thickness of preferably tens of microns (e.g., >30 µm) to avoid punch-through pinholes, a constraint that the present disclosure may avoid; (ii) thin flat Si films have much reduced mean optical path length, which reduces IR absorption and results in reduced cell quantum efficiency, whereas the present disclosure may trap light extremely efficiently by virtue of its 3-D nature; (iii) flat TF Si has poor mechanical strength for cell and module processing needs, whereas the present disclosure may be more mechanically robust because of its 3-D structure.

According to the teachings of the present disclosure, the design parameters of 3-D TFSSs may be varied in order to allow a desired percentage of sunlight to pass through. In this way, partially transparent solar cells having a desired transmissivity may be fabricated.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with ordinary skill in the art upon examination of the following FIGURES and detailed description. It is intended that all such additional systems, methods, features and advantages included within this description be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings, in which like reference numerals indicate like features and wherein:

FIG. 12 shows an embodiment of a process flow for creating see-through holes in a 3-D TFSS;

FIGS. 14A-14C show a cross-sectional view of an embodiment of creating and releasing a TFSS from a reusable template;

DETAILED DESCRIPTION

Figure 1:
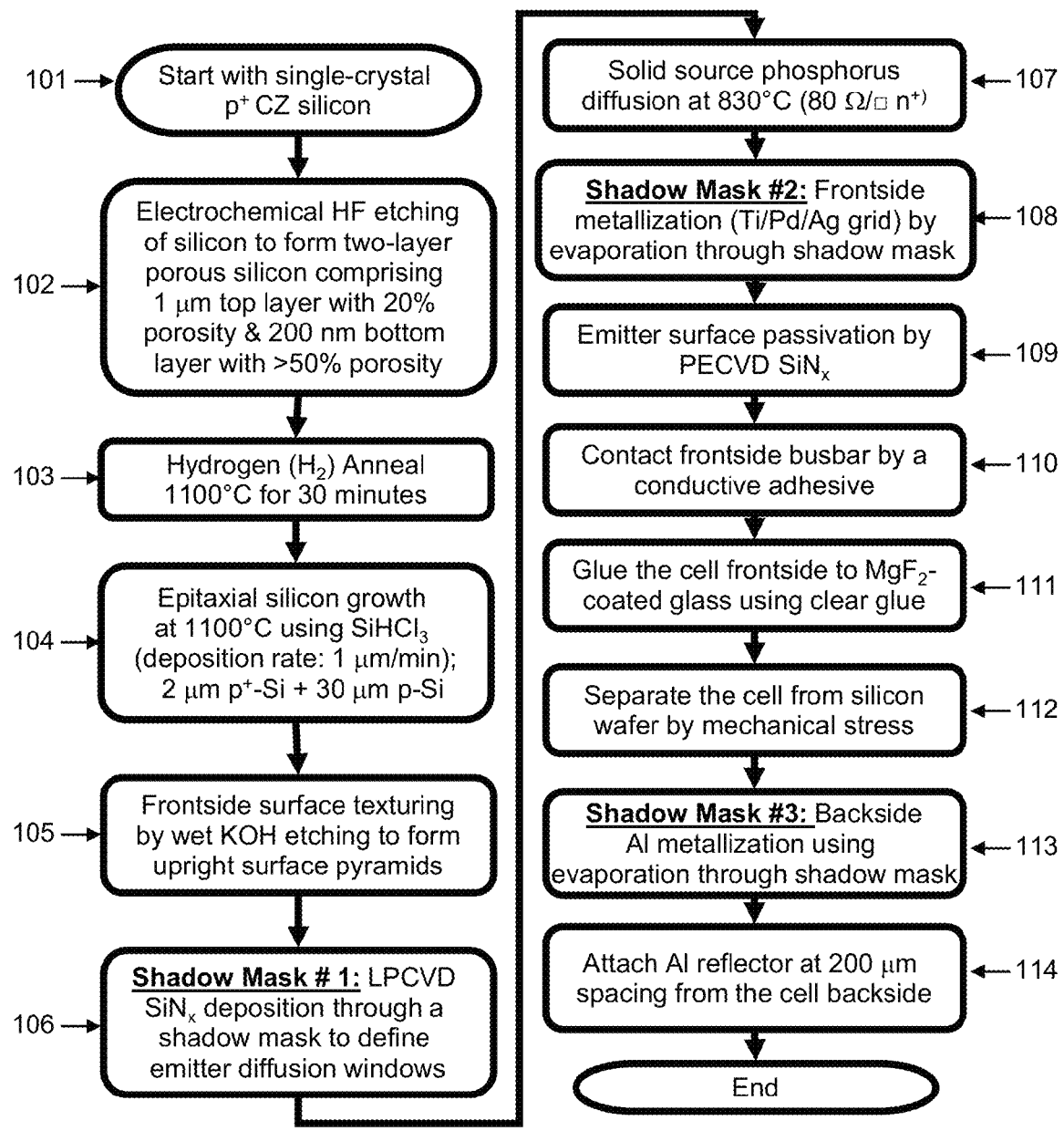
FIG. 1 (PRIOR ART) shows a prior art process flow for planar silicon lift off.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

Although specific reference is made herein to a honeycomb (hexagonal) structure, the implementation of the present disclosure is generally applicable to any geometrical shape and any taper-angled trenches with arbitrary depth. The specific honeycomb implementation only serves to demonstrate the advantages and one possible implementation.

One possible semiconductor material for the 3-D TFSC is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, or a combination thereof. Monocrystalline silicon may be advantageous as a material because of its potential for high conversion efficiency. This disclosure enables the production of see-through three-dimensional monocrystalline silicon thin film solar cells, but the designs disclosed are also applicable to other semiconductor materials such as germanium, silicon germanium, silicon carbide, a crystalline compound semiconductor, or a combination thereof. Additional applications include copper indium gallium selenide (CIGS) and cadmium telluride (CdTe) semiconductor thin films.

FIG. 1 (prior art) shows an example of a prior art process flow for planar silicon lift off, to be compared to the process flows shown in FIGS. 28-31. At step 102, single-crystal silicon, such as that grown by the Czochralski process, is electrochemically etched by HF to produce two layers of porous silicon, having different porosities. The silicon is then annealed in hydrogen at step 103.

Two new layers of differently doped silicon are then epitaxially deposited at step 104, for a total thickness of approximately 32 microns. Wet KOH etching is used at step 105 for the surface texturing.

Step 106 is the first shadow mask step, using low-pressure chemical vapor deposition (LPCVD) to define emitter diffusion windows. Then step 107 diffuses phosphorous dopant from a solid source.

Step 108 is the second shadow mask step, providing frontside metallization. Then the emitter surface is passivated by plasma-enhanced chemical vapor deposition (PECVD) at step 109. Step 110 provides a frontside busbar, and in step 111 the cell is glued to glass coated with $MgF_2$. The cell is finally separated from the silicon wafer by mechanical stress at step 112, and back side metallization is applied in a third shadow mask step 113. An aluminum reflector may then be applied to the back side of the cell in step 114.

Figure 2:
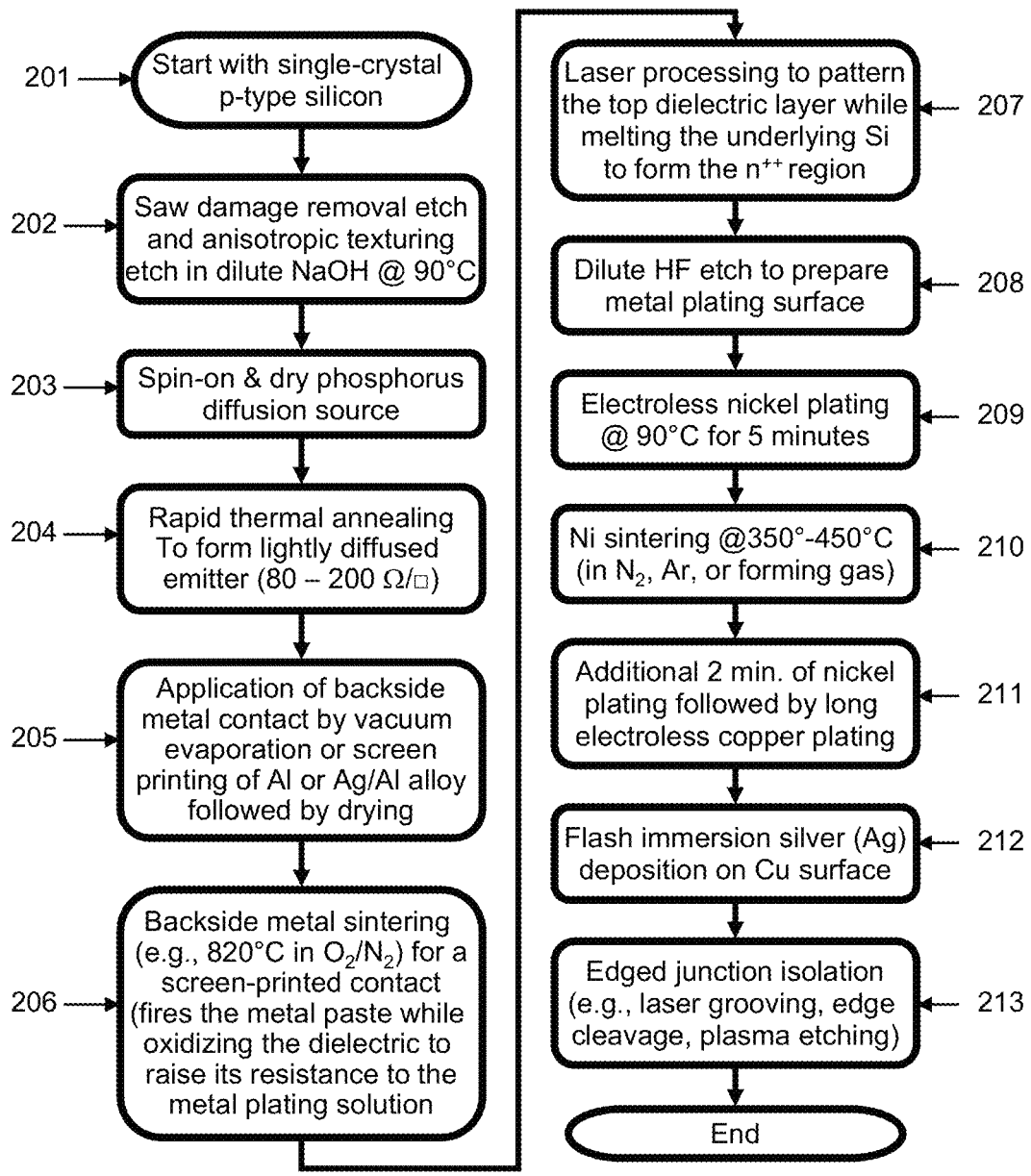
FIG. 2 (PRIOR ART) shows a prior art process flow for application of self-aligned selective emitter and metallization.

FIG. 2 (prior art) shows an example of a prior art process flow for application of self-aligned selective emitter and metallization to a TFSC. First, saw damage is removed from the single-crystal p-type silicon by etching, and the surface is anisotropically etched in NaOH at step 202. Step 203 shows application of the spin-on and dry phosphorous diffusion source, which is then rapidly annealed in step 204 to form a lightly diffused emitter. Back side metal contacts are applied in step 205 by either vacuum evaporation or screen printing. If the back side metal is screen-printed, step 206 provides for sintering to fire the metal paste and oxidize the dielectric.

In step 207, the top dielectric layer is patterned by laser processing. Then in steps 208-212, metal plating is applied: first the surface is etched in dilute HF to prepare it for metal plating, then electroless nickel plating is applied and sintered, then additional nickel and copper are plated, and then silver is deposited on the copper surface. Finally, edged junction isolation is performed in step 213.

Figure 3:
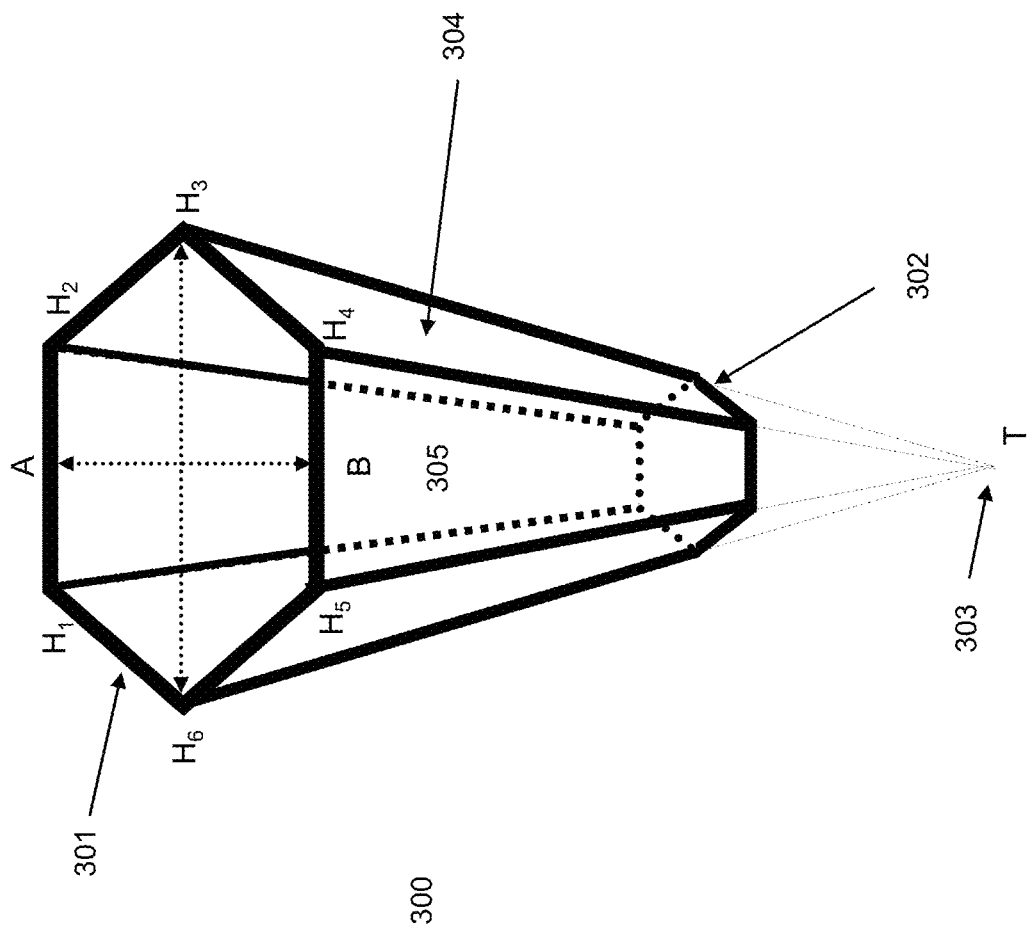
FIG. 3 shows an isometric view of an embodiment of a hexagonal truncated pyramid unit cell.

FIG. 3 shows an embodiment 300 of a hexagonal truncated pyramid unit cell in accordance with the present disclosure. Unit cell 300 has a top aperture 301, a bottom aperture 302, and 6 side walls 304. The imaginary tip 303 of the cell is marked T and is the point at which the side walls 304 would converge if the pyramid were not truncated at its bottom aperture 302. $H_1$ through $H_6$ denote the vertices of the hexagon defined by top aperture 301. The empty space in the interior of the unit cell is referred to as a trench and is marked with reference number 305.

The locations marked A and B indicate the midpoints of line segments $H_1H_2$ and $H_4H_5$, respectively. $\alpha$ is defined as the angle ATB, and $\beta$ is defined as the angle $H_6TH_3$.

Figure 4:
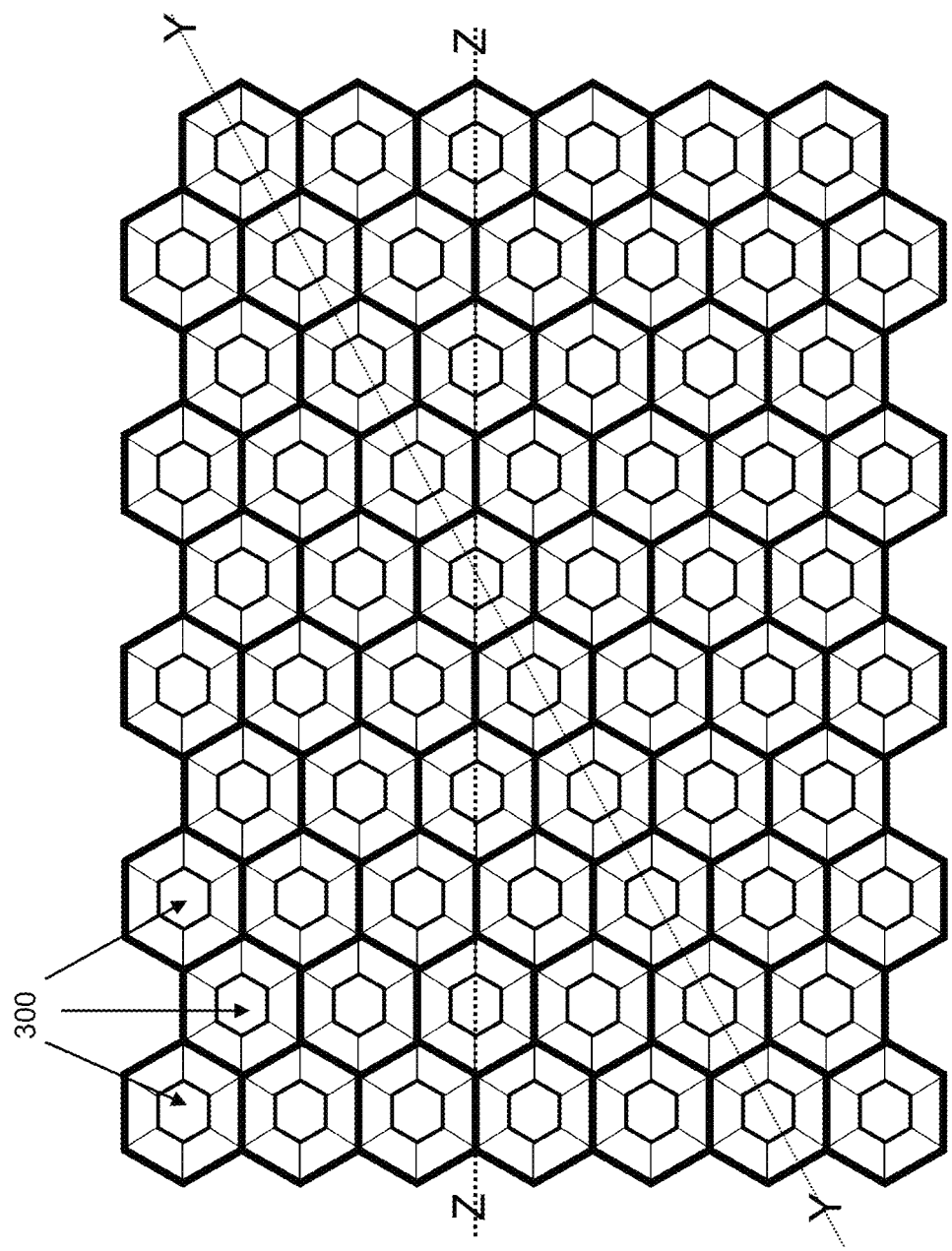
FIG. 4 shows a top view of a section of an embodiment of a hexagonal truncated pyramid TFSC.

FIGS. 4-10 depict several illustrative embodiments of 3-D TFSCs constructed using truncated pyramid unit cells of different shapes. FIG. 4 shows a substrate comprising an array of hexagonal unit cells 300. Lines Y and Z define two planes that will be referred to when viewing cross sections of this embodiment. Although the arrangement of FIG. 4 will frequently be referred to to demonstrate the advantages of the present disclosure, the hexagonal structure is merely illustrative of one embodiment. FIGS. 5-10 demonstrate some others possible embodiments, and the present disclosure is not limited to any particular choice of geometric shape for the unit cells.

Figure 5:
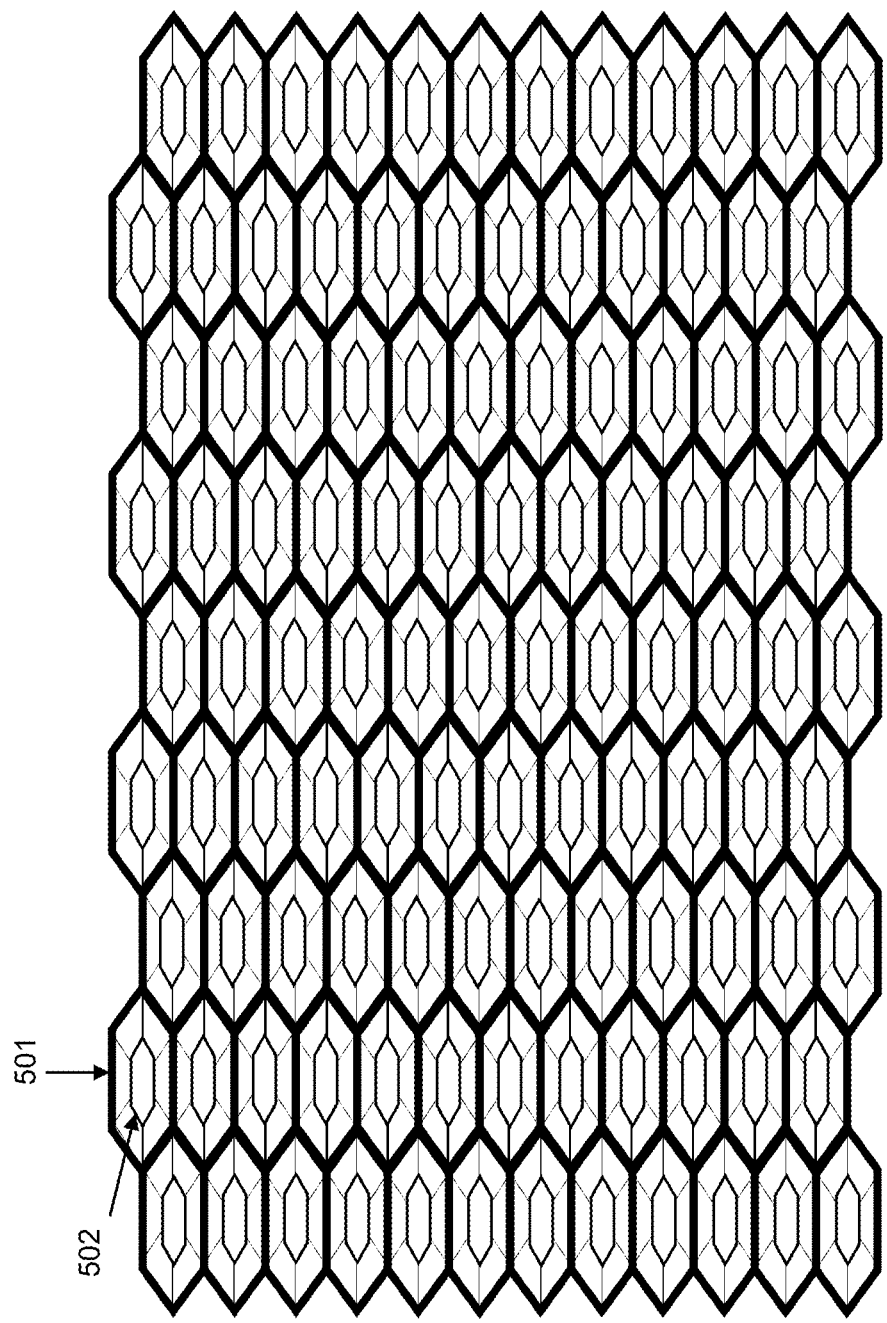
FIG. 5 shows a top view of a section of an embodiment of a hexagonal truncated pyramid TFSC.

FIG. 5 shows a substrate comprising an array of irregular hexagonal unit cells having top apertures 501 and bottom apertures 502. As this FIGURE demonstrates, the unit cells need not be regular polygons.

Figure 6:
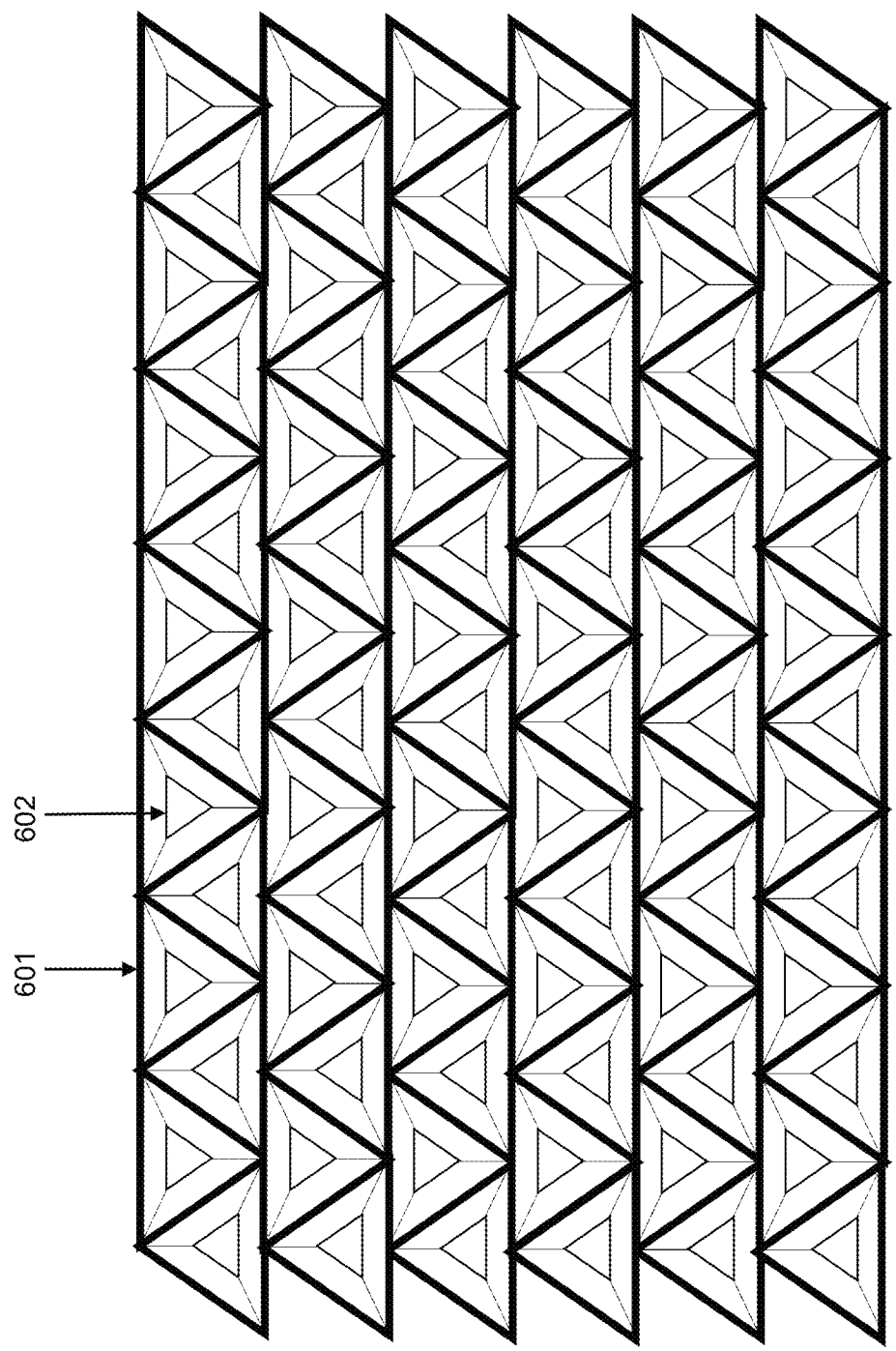
FIG. 6 shows a top view of a section of an embodiment of a triangular truncated pyramid TFSC.

FIG. 6 shows a substrate comprising an array of triangular unit cells having top apertures 601 and bottom apertures 602.

Figure 7:
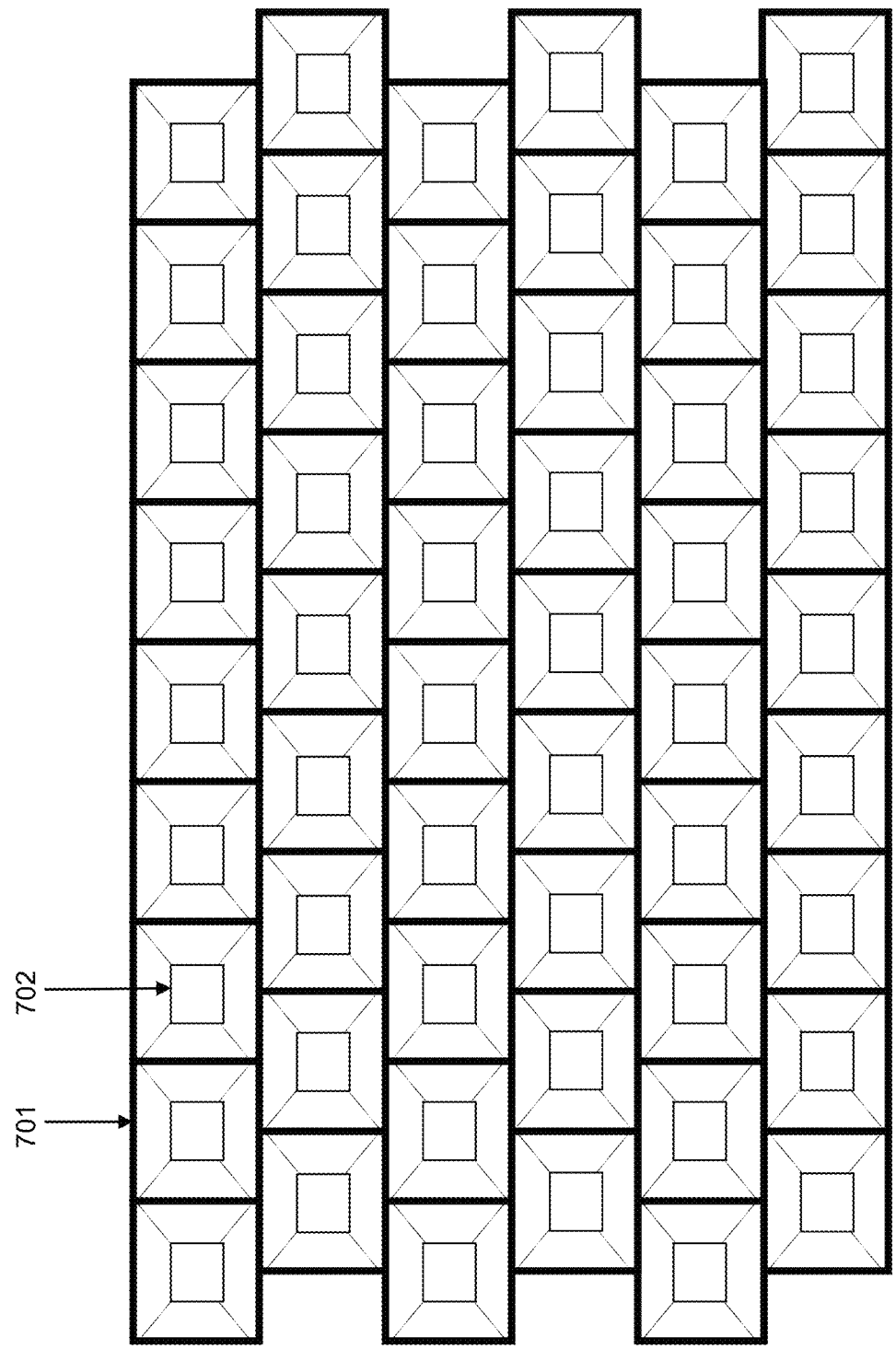
FIG. 7 shows a top view of a section of an embodiment of a square truncated pyramid TFSC.

FIG. 7 shows a substrate comprising an array of square unit cells having top apertures 701 and bottom apertures 702.

Figure 8:
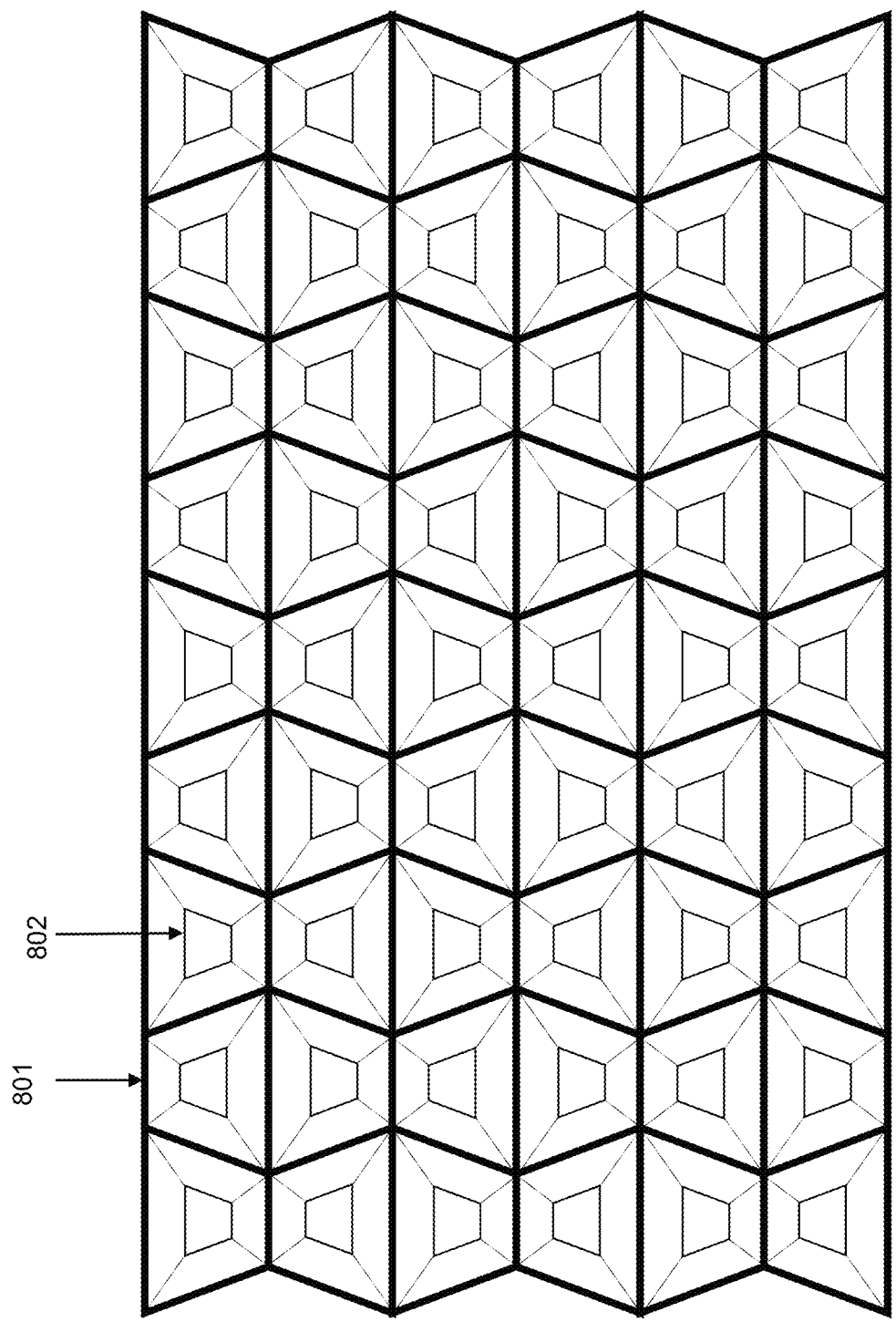
FIG. 8 shows a top view of a section of an embodiment of a trapezoidal truncated pyramid TFSC.

FIG. 8 shows a substrate comprising an array of trapezoidal unit cells having top apertures 801 and bottom apertures 802.

Figure 9:
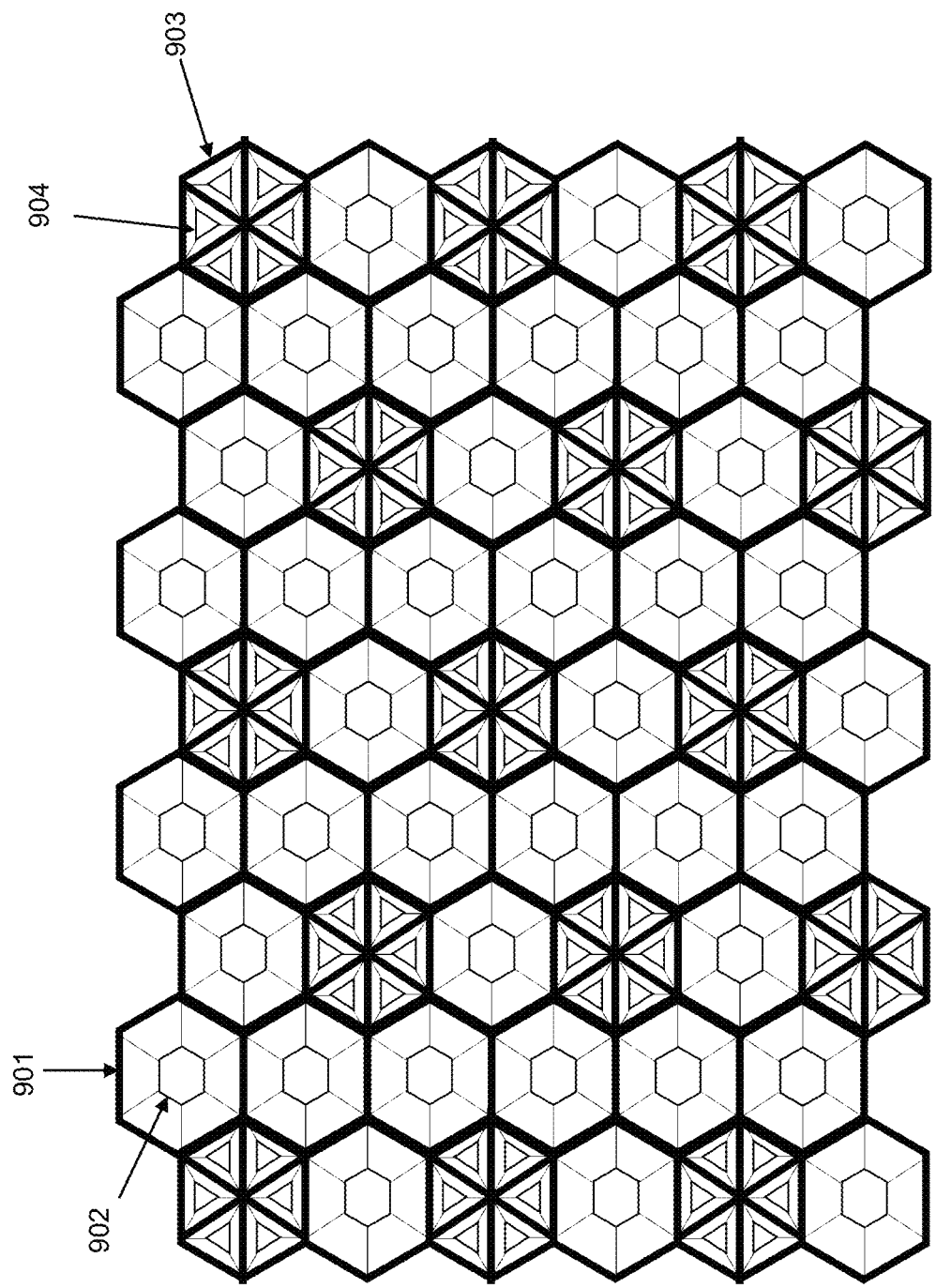
FIG. 9 shows a top view of a section of an embodiment of a truncated pyramid TFSC including hexagonal and triangular unit cells.

FIG. 9 shows a substrate comprising a periodic array of both hexagonal and triangular unit cells. The hexagonal unit cells have top apertures 901 and bottom apertures 902, and the triangular unit cells have top apertures 903 and bottom apertures 904.

Figure 10:
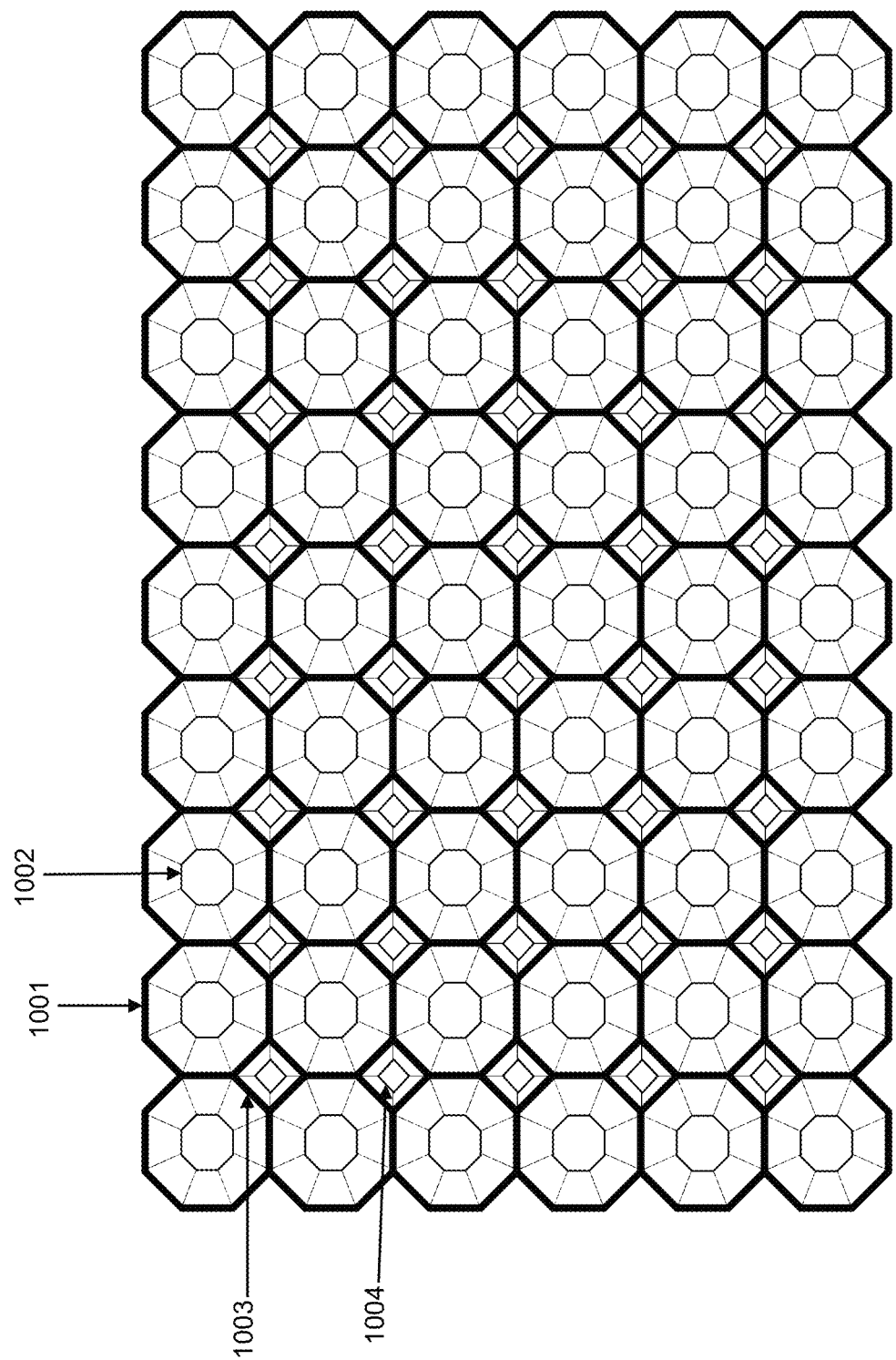
FIG. 10 shows a top view of a section of an embodiment of a truncated pyramid TFSC including octagonal and square unit cells.

FIG. 10 shows a substrate comprising a periodic array of both octagonal and square unit cells. The octagonal unit cells have top apertures 1001 and bottom apertures 1002, and the square unit cells have top apertures 1003 and bottom apertures 1004.

Although the embodiments disclosed in these FIGURES show periodic arrays of one or two types of unit cells, the present disclosure could be incorporated by one of ordinary skill into a substrate using any configuration of any number of differently shaped unit cells, whether periodic or non-periodic.

Figure 11:
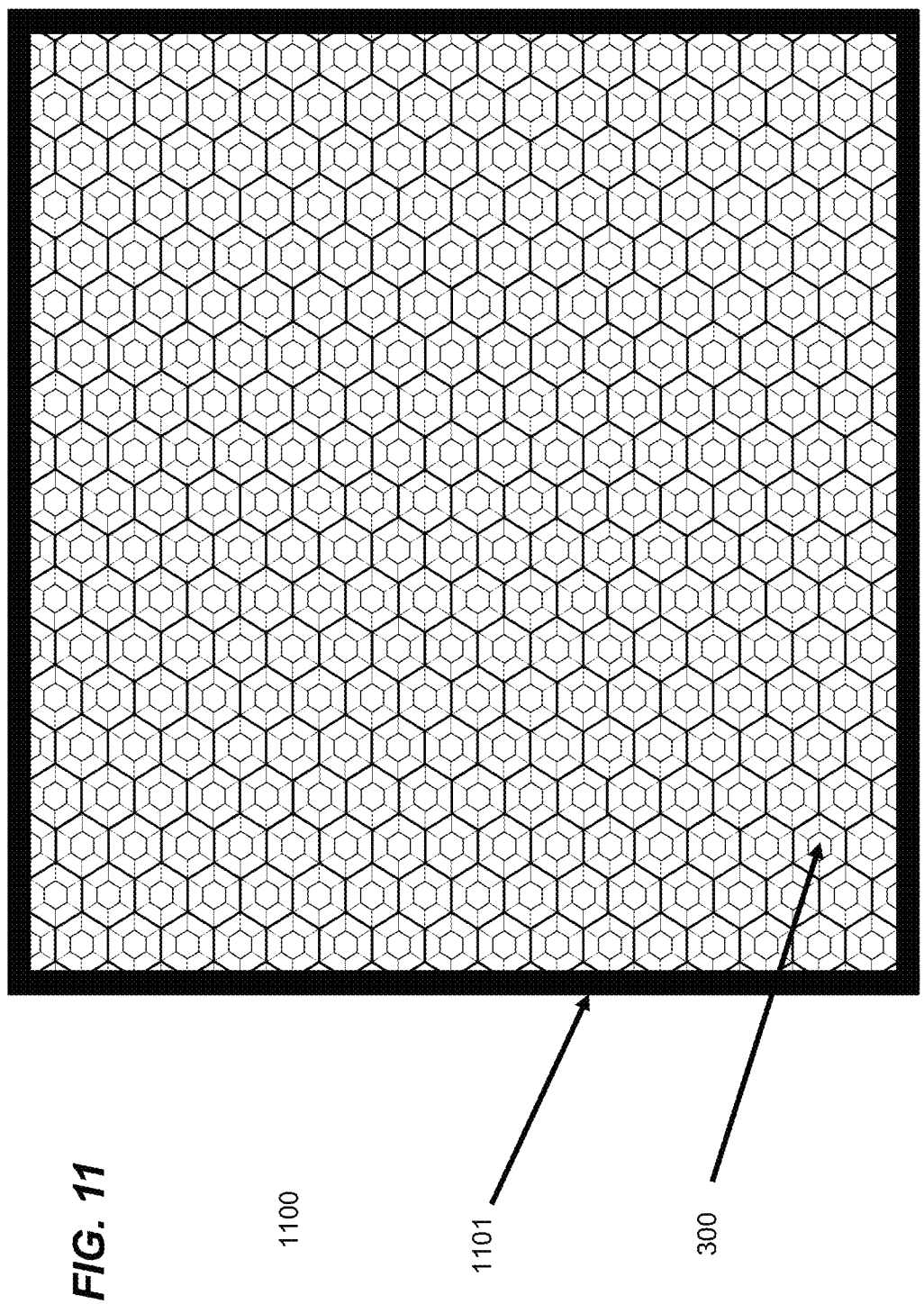
FIG. 11 shows a top view of an embodiment of a hexagonal truncated pyramid TFSC with a planar peripheral silicon frame.

FIG. 11 shows a hexagonal truncated pyramid solar cell substrate 1100 comprising unit cells 300 and silicon substrate frame 1101. In one embodiment, frame 1101 has a width of between about 50 and 500 microns.

According to one aspect of the disclosed subject matter, there is provided a fabrication method for making the see-through holes on the 3-D TFSS by using self-aligned coating and etching processes. The fabrication process of making see-through holes/openings in a released 3-D TFSS includes a self-aligned thin hard mask layer coating/deposition, selective hard mask layer opening, controlled silicon etching, and subsequent cleaning steps.

FIG. 12 outlines the major fabrication steps of an embodiment of making see-through holes on a released 3-D TFSS.

The see-through hole making process starts at step 1201 with a released and cleaned 3-D TFSS with arrayed pyramidal cavities. A hard mask layer is deposited to cover the front, back and side surfaces of the 3-D TFSS in step 1202. The hard mask material is used to protect surfaces from the subsequent silicon etching, such a KOH etching. The mask materials may include but are not limited to thermally grown oxide ($SiO_2$) and LPCVD nitride. If $SiO_2$ is used, the oxide layer thickness may be in the range of about 0.05 um to 0.5 um. Next, at step 1203, the hard mask layer at the bottom side (backside) of the 3-D TFSS is selectively removed by self-aligned methods, such as coating with an etch paste or liquid by, e.g., roller coating, dip coating, or screen printing. The hard mask etching material only makes contacts to the bottom tip areas of the 3-D TFSS. During the selective coating process or subsequent curing process, the hard mask layer in contact with the etchant is etched and removed. After that, the remaining etchant material is removed by cleaning. As a result, only the silicon surface at the 3-D TFSS bottom tip areas is exposed while the rest of silicon surfaces are still covered by the hard mask layer. Next, at step 1204, controlled silicon etching, such as KOH silicon etching, is used to form the backside openings. The size of the see-through openings is controlled by the silicon etching time. After forming the see-through holes, the remaining mask layer is removed by chemical etching and the see-through 3-D TFSS may be cleaned by standard RCA1 and RCA2 cleaning following by DI water rinsing and drying at step 1205. The cleaned 3-D TFSS with or without see-through holes is then ready for the subsequent cell process.

Figure 13A:
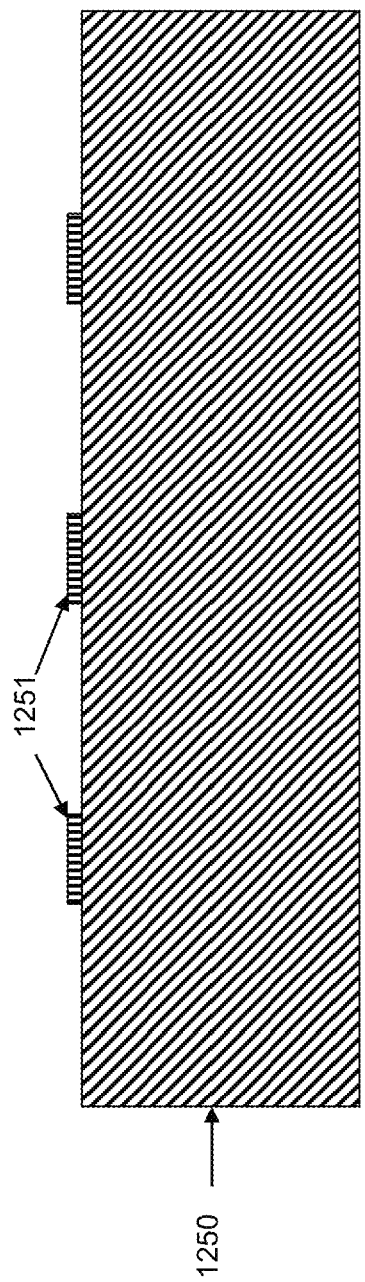
FIGS. 13A-13C show a cross-sectional view of an embodiment of a formation process for a reusable template.
Figure 13B:
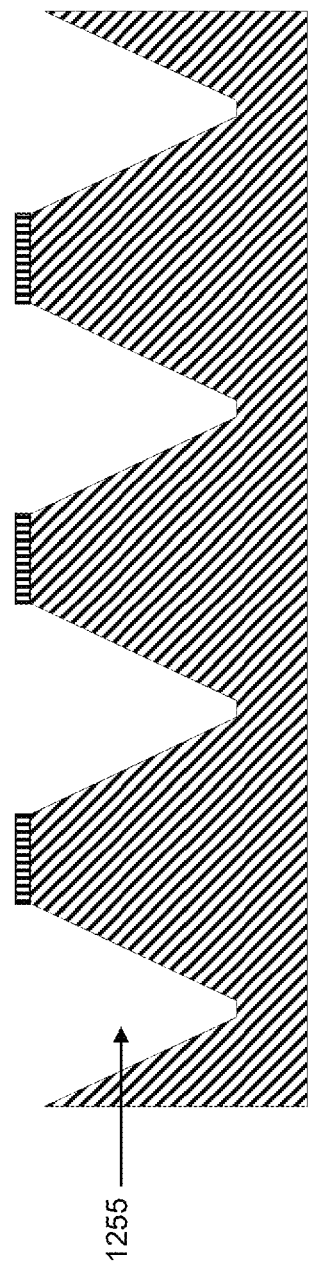
Figure 13C:

FIGS. 13A-13C show cross-sectional views of a silicon wafer for illustrating the reusable template making process. The cross-sectional views of the template, such as the one shown in FIG. 4, are cut along the ZZ plane.

FIG. 13A shows a cross-sectional view of a single-crystalline or multi-crystalline silicon wafer 1250 with thickness in the range of 0.3 to 3 mm. The wafer could be in a standard circular shape or a square shape of approximately 150 mm×150 mm to 200 mm×200 mm. If low-cost metallurgical-grade silicon is used, a gettering process may optionally be performed first. A masking layer 1251 is coated or deposited on one or both sides of the silicon wafer. A honeycomb array pattern may be made in the masking layer by photolithography. As an example, the masking layer may be a patterned photoresist layer.

FIG. 13B shows a cross-sectional view of the silicon wafer after creating trenches 1255 by performing a high-rate Reactive Ion Etch (RIE). During this silicon etching, the masking layer is used to protect the silicon surfaces that are not to be etched. The silicon RIE parameters may be adjusted to produce a low-angle, near-vertical hexagonal pyramid sidewall slope. As shown here, the bottom of the trenches end within in the silicon wafer without punching through. Alternatively, the RIE may be allowed to produce small-diameter (e.g., <5 um) holes at the bottom of pyramids by punching though the substrate backside.

FIG. 13C shows a cross-sectional view of the fabricated reusable silicon template after removing the remaining masking layer. A diluted HF etch may be performed to remove the native oxide and passivate the surface with hydrogen (Si—H bonds) in preparation for subsequent fabrication of 3-D TFSS.

FIGS. 14A-14C show cross-sectional views of a reusable silicon template for illustrating the 3-D TFSS making process. The cross-sectional views of the template, such as the one shown in FIG. 4, are cut along the ZZ plane.

FIG. 14A shows a cross-sectional view of the reusable template after forming a bi-layer porous silicon thin layer 1260 on its structured side. The porous silicon layer may consist of a top layer of low-porosity (20%~40%) silicon on a layer of high-porosity (40%~80%) silicon and may be formed by using electrochemical HF etching (also known as electrochemical anodization of silicon).

FIG. 14B shows a cross-sectional view of the reusable template after epitaxial silicon layer 1261 has been grown in an epitaxial reactor. The epitaxial layer thickness is in the range of 2 microns to 50 microns. A hydrogen baking/annealing process may be conducted prior to the epitaxial silicon growth. The epitaxial silicon layer may be doped with p-type and/or n-type dopants during its epitaxial growing process.

FIG. 14C shows a cross-sectional view of the reusable silicon template and a released 3-D TFSS 1265. The released 3-D TFSS is ready for the subsequent cell fabrication process, while the template is cleaned by diluted silicon wet etchant, such as diluted KOH, to remove the silicon debris. The template is then ready for the next reuse cycle.

FIGS. 15A-15D show cross-sectional views of a released 3-D TFSS such as the one shown in FIG. 4, and cut along the ZZ plane, for illustrating the see-through hole making process.

Figure 15A:
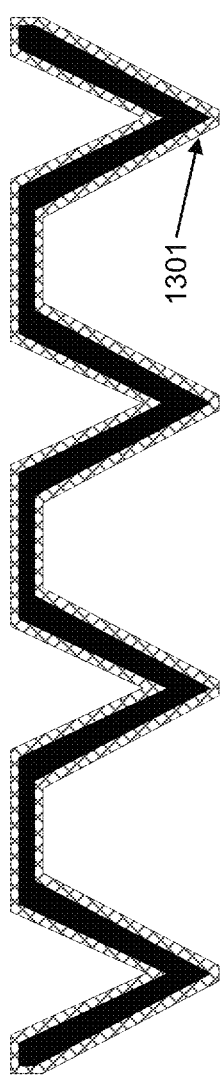
FIGS. 15A-15D show a cross-sectional view of an embodiment of creating see-through holes in a 3-D TFSS.

FIG. 15A shows a cross-sectional view of a released 3-D TFSS after its hard mask layer deposition process. The silicon surfaces of the 3-D TFSS are fully covered with hard mask layer 1301, such as a thermal oxide ($SiO_2$) layer of 0.05 micron to 0.5 micron thickness.

Figure 15B:
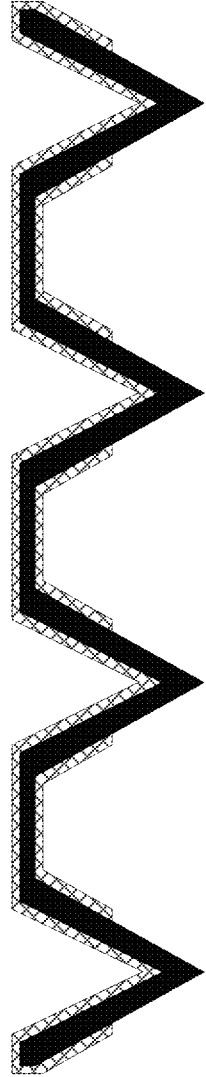

FIG. 15B shows a cross-sectional view of the 3-D TFSS with the hard mask layer at the bottom tip areas selectively removed by chemical etching.

Figure 15C:
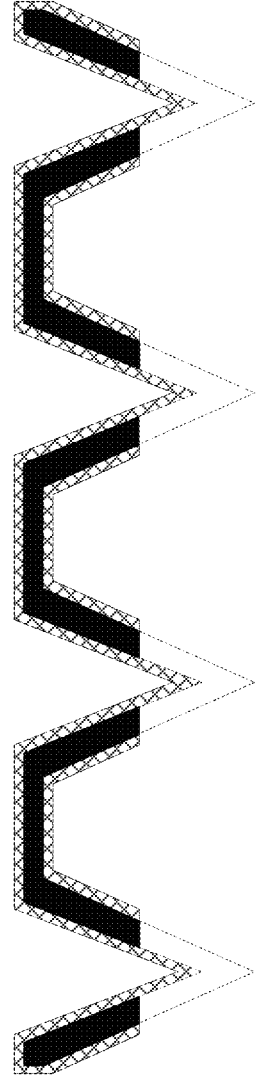

FIG. 15C shows a cross-sectional view of the 3-D TFSS with etched see-through holes by controlled silicon etching, such as KOH etching.

Figure 15D:
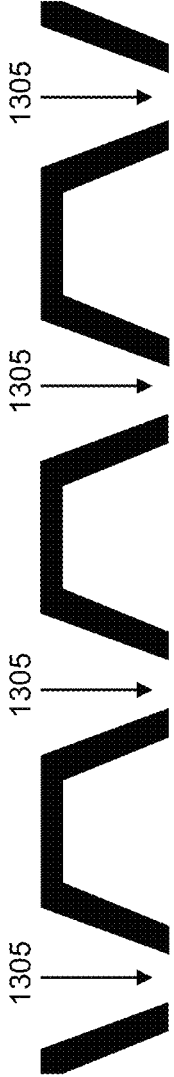

FIG. 15D shows a cross-sectional view of the fabricated see-through 3-D TFSS after removal of the remaining hard mask layer, ready for subsequent cell fabrication processes.

Figure 16:
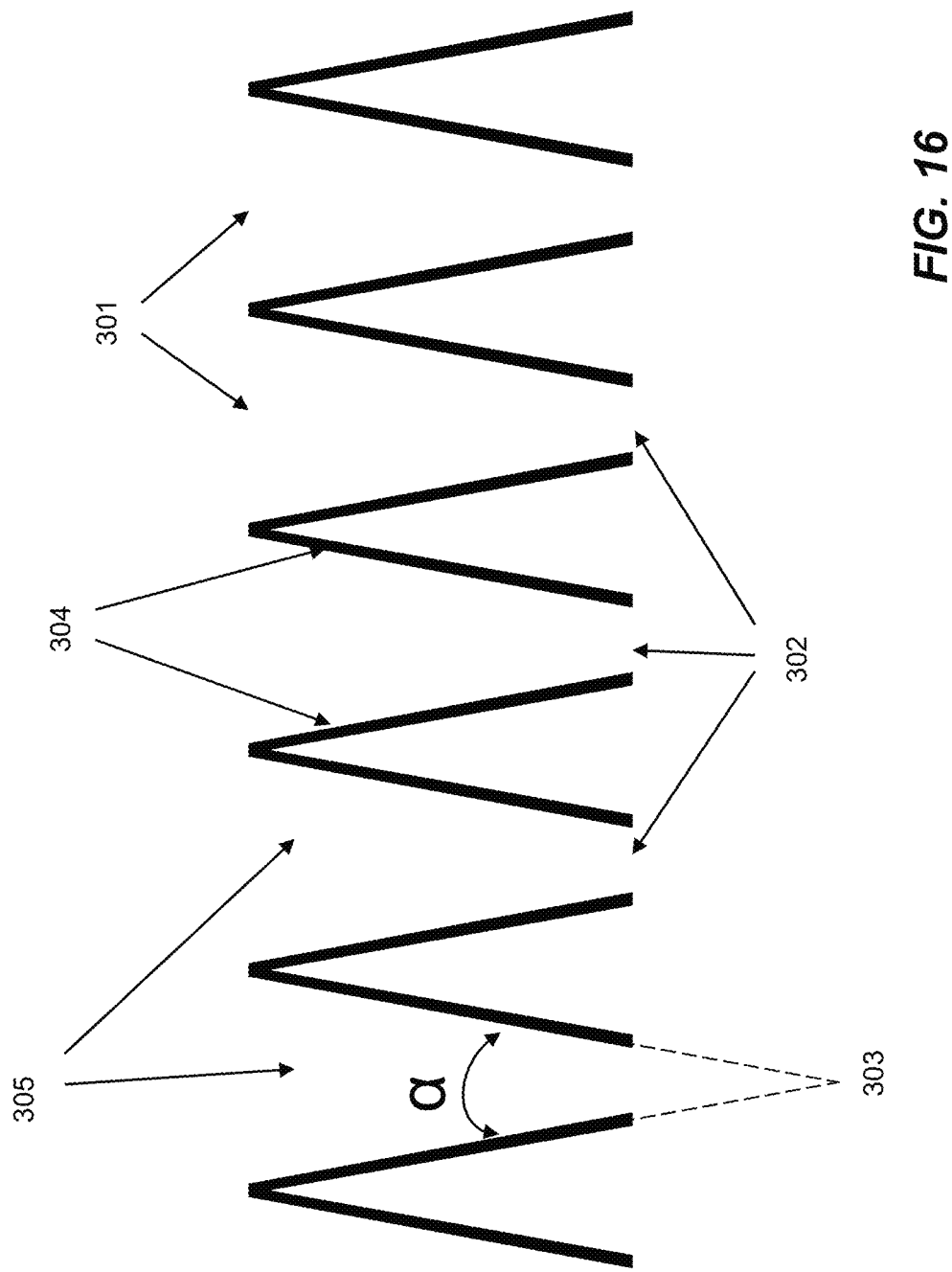
FIG. 16 shows a cross-sectional view of an embodiment of a silicon substrate with hexagonal truncated pyramid unit cells.

FIG. 16 shows a cross-sectional view of a silicon substrate such as the one used to produce the TFSC shown in FIG. 4, cut along the YY plane. Top apertures 301 and bottom apertures 302 are shown. Side walls 304 define trenches 305. Angle α is shown, as before, as the angle that imaginary pyramid tip 303 makes with the midpoints of opposite sides of the hexagon defined by top aperture 301.

Figure 17:
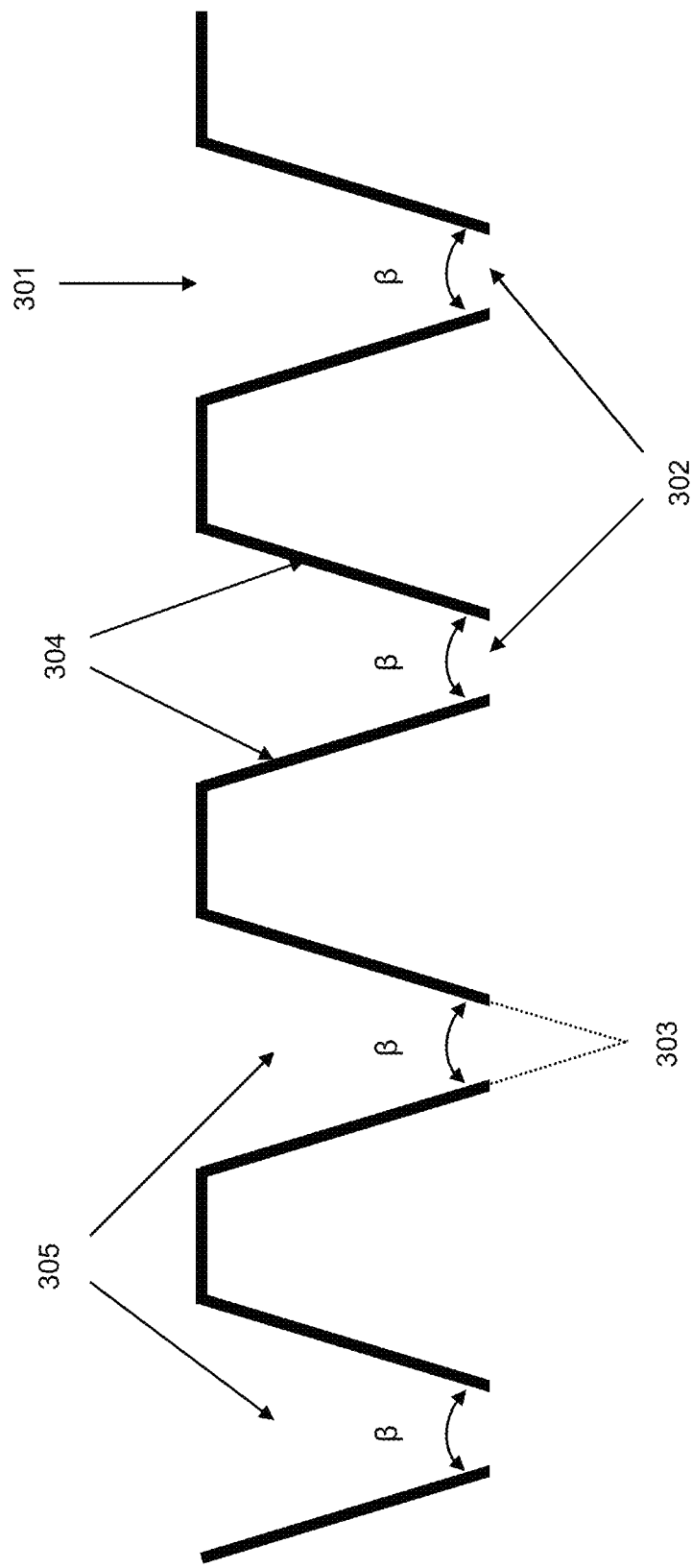
FIG. 17 shows a cross-sectional view of an embodiment of a silicon substrate with hexagonal truncated pyramid unit cells.

FIG. 17 shows another cross-sectional view of a silicon substrate such as the one used to produce the TFSC shown in FIG. 4, this time cut along the ZZ plane. Top apertures 301 and bottom apertures 302 are shown. Side walls 304 define trenches 305. Angle β is shown as the angle that imaginary pyramid tip 303 makes with the vertices of the hexagon defined by top aperture 301.

Figure 18:
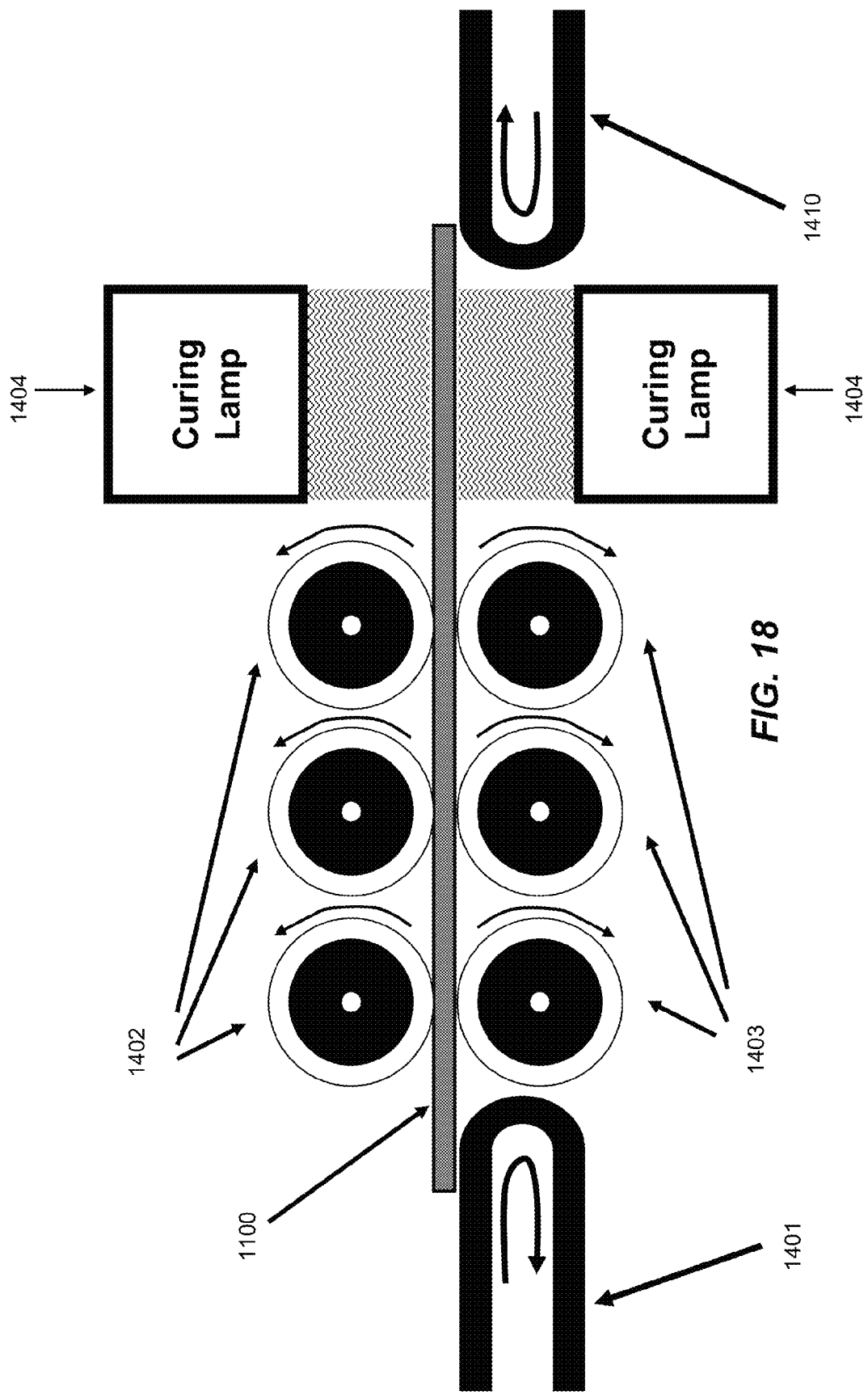
FIG. 18 shows a side view of an embodiment of a roller coating system for applying dopants.

FIG. 18 shows an embodiment of a roller setup for doping a substrate such as the partially transparent 3-D TFSCs of the present disclosure. In this embodiment, input conveyor belt 1401 moves substrate 1100 onto rollers that apply dopant paste. The rollers may rotate and press on the wafer from both sides with a controllable force. Top rollers 1402 are coated with n-type dopant paste, and bottom rollers 1403 are coated with p-type dopant paste. The wafer may then enter curing lamps 1404, which may be infrared, ultraviolet, or another type of curing lamp. After the dopant paste has been cured, the wafer may travel out of the system by way of output conveyor belt 1410 for annealing.

Figure 19:
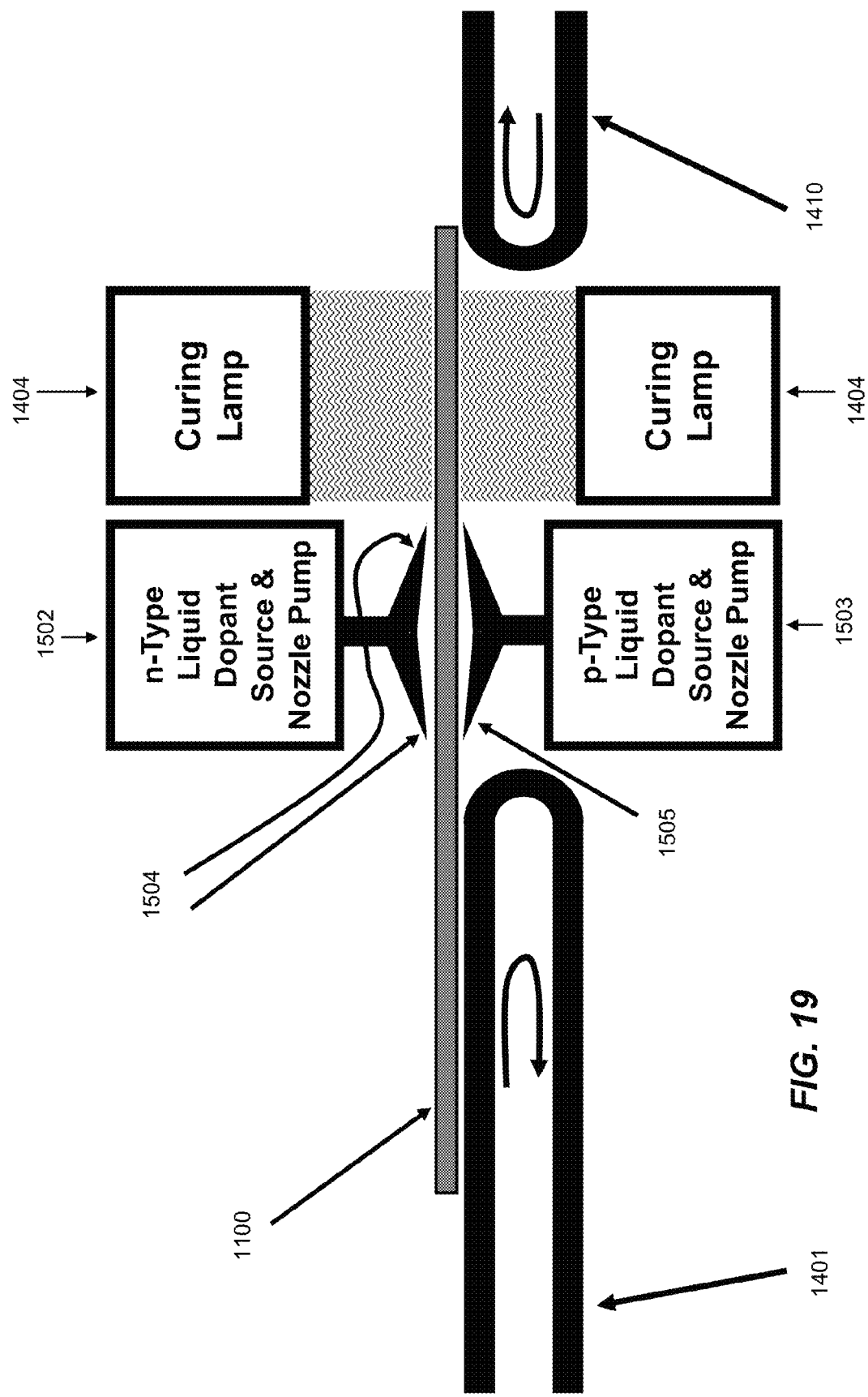
FIG. 19 shows a side view of an embodiment of a spray coating system for applying dopants.

FIG. 19 shows an embodiment of a non-contact spray coating setup for doping a substrate such as the partially transparent 3-D TFSCs of the present disclosure. In this embodiment, input conveyor belt 1401 moves substrate 1100 into a spray coating apparatus. The substrate may be air lifted or air levitated on the conveyor belt. The top side of substrate 1100 is sprayed with liquid n-type dopant by nozzles 1504, which are fed by reservoir and pump 1502. The bottom side is sprayed with liquid p-type dopant by nozzles 1505, which are fed by reservoir and pump 1503. The nozzles 1504 and 1505 may cover the entire width of the substrate as it passes between them. The nozzles 1504 and 1505 also may be angled with respect to the surface of the substrate, spraying it at a sharp angle. Then, as in FIG. 18, substrate 1100 passes through curing lamps 1404, and travels out of the system on conveyor belt 1410 for annealing.

Figure 20:
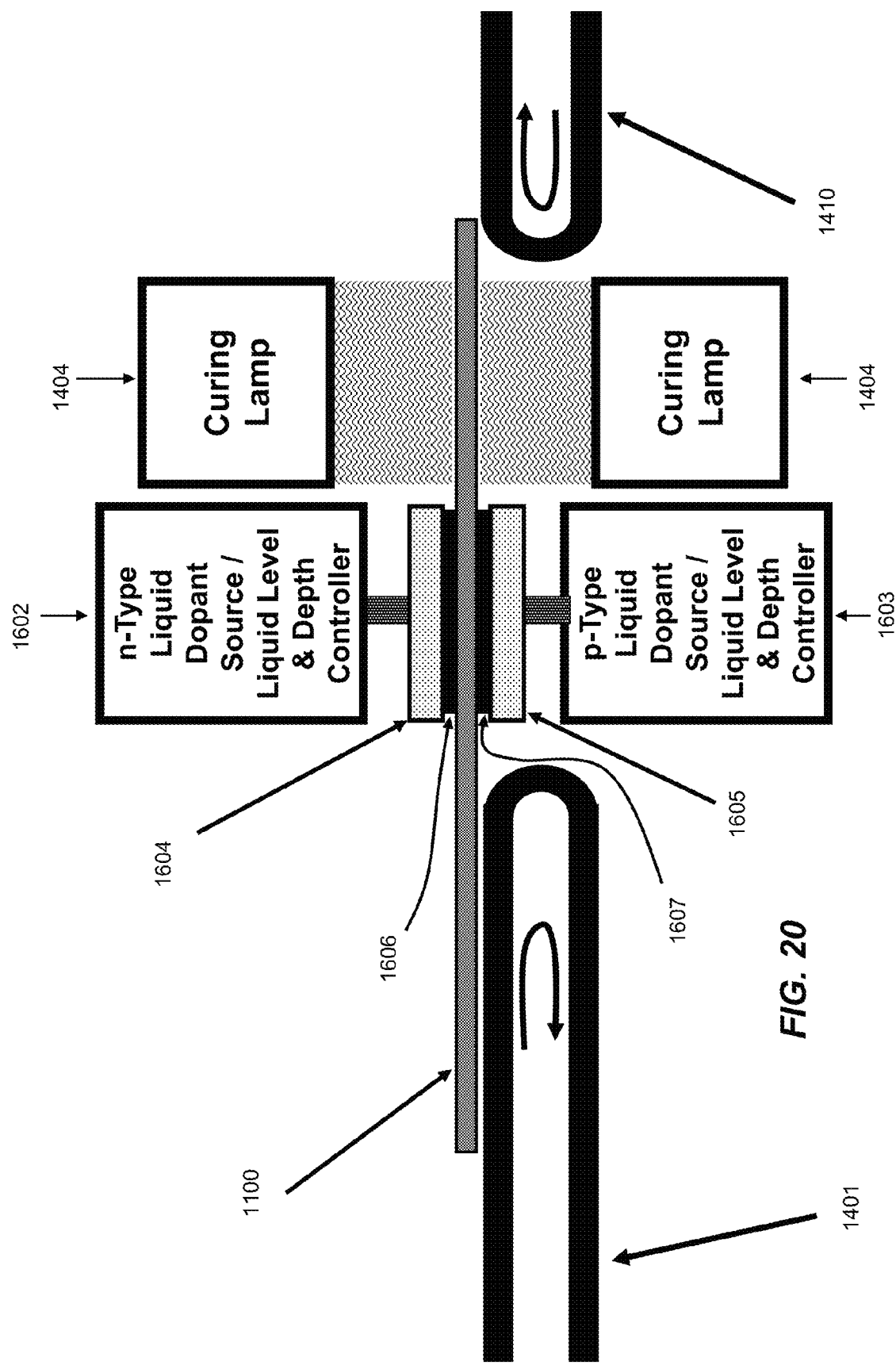
FIG. 20 shows a side view of an embodiment of a dip coating system for applying dopants.

FIG. 20 shows an embodiment of a dip coating setup for doping a substrate such as the partially transparent 3-D TFSCs of the present disclosure. In this embodiment, input conveyor belt 1401 moves substrate 1100 into liquid film dispensers 1604 (n-type) and 1605 (p-type). These dispensers are fed by liquid dopant source/liquid level and depth controllers 1602 and 1603, and produce controlled-thickness liquid dopant films 1606 and 1607, respectively. Then, as in FIGS. 18 and 19, substrate 1100 travels out of the system on output conveyor 1410 for annealing. All of the doping embodiments shown in FIGS. 18-20 may be carried out at atmospheric pressure.

Figure 21:
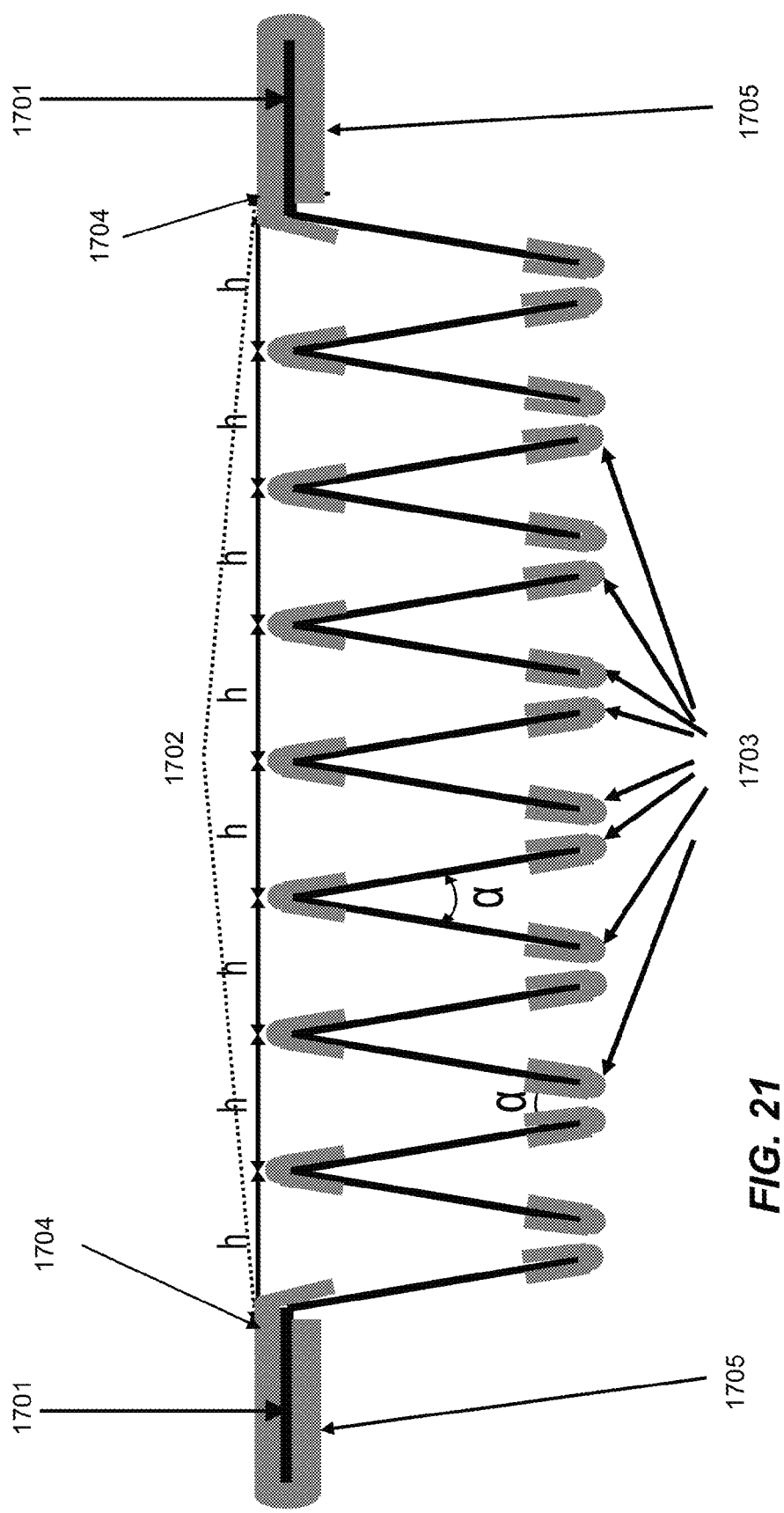
FIG. 21 shows a cross-sectional view of an embodiment of a hexagonal truncated pyramid TFSC with a thin planar peripheral silicon frame and self-aligned base and emitter contacts.

FIG. 21 shows a cross-sectional view of a 3-D TFSC such as the one of FIG. 4, cut along the YY plane. A substrate may have either a thin or a thick silicon frame around its edges. The substrate shown in FIG. 21 has a thin silicon frame 1701 at its edges. The unit cells in FIG. 21 have had metallized contacts applied on both the front and back sides. Front side self-aligned base contacts 1702 cover substantially all of the hexagonal ridges making up the front of the substrate and are, in some embodiments, silver, aluminum, or some other metal. These ridges comprise interconnected continuous ridges interspersed among and bordering the pyramidal cavities, and they may have a ridge width approximately in the range of 2 to 20 microns; in some embodiments they may be even narrower, approximately between 0.5 and 5 microns. Front side self-aligned base contacts 1702 may be formed by, for example, fire-through metallization or by plating. Front side contacts 1702 may form an interconnected hexagonal contact pattern throughout the entire substrate, because the top ridges may be in electrical contact with one another. Back side self-aligned emitter contacts 1703 may cover substantially all of the isolated hexagonal ridges making up the back side of the substrate. The back side hexagonal ridges may be isolated from one another, because the smaller back side bottom apertures do not form a continuous grid. Contacts 1703 may be made of silver, aluminum, or some other metal; they may also be formed by fire-through metallization or by plating. The front side contacts 1702 are connected to frame-edge front side contact 1704. Frame-edge front side contact 1704 may also be connected to frame-edge back side contact 1705 through either a wrap-around or a wrap-through connection. This connection between contact 1704 and contact 1705 may allow for simpler automation of solar module assembly. The TFSC of FIG. 21 may be square or rectangular with dimensions of about 150 mm to more than 200 mm.

Figure 22:
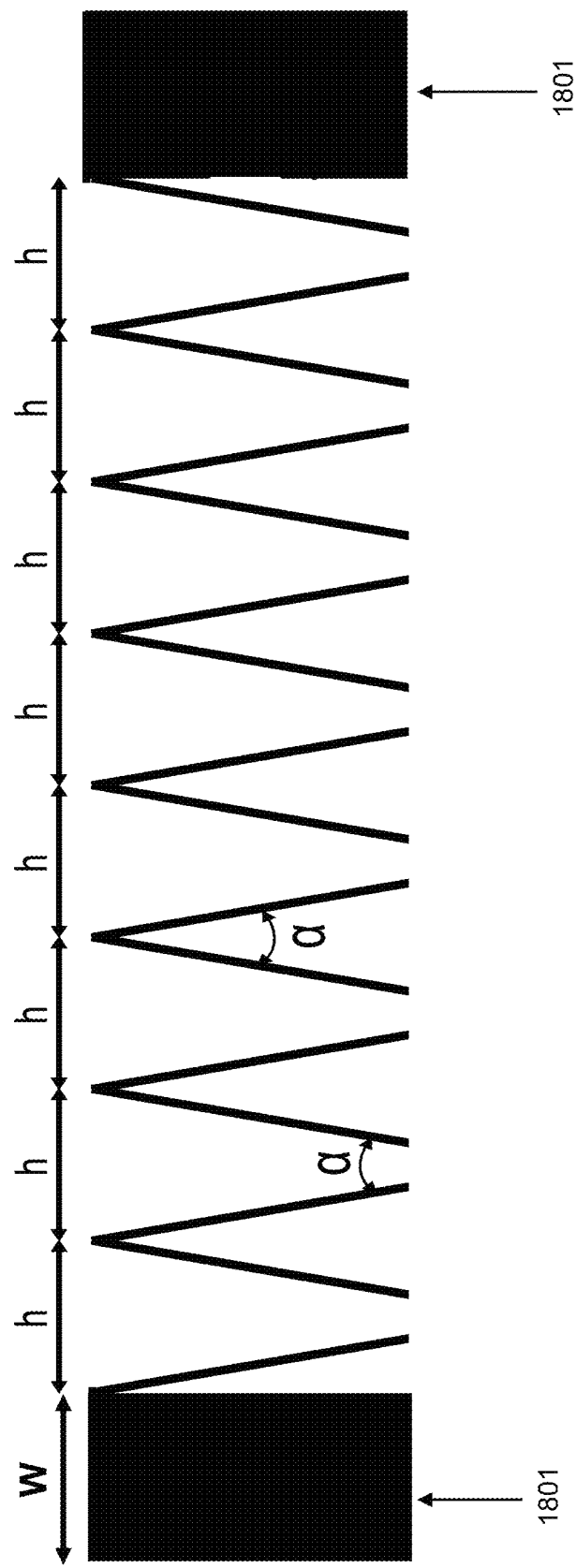
FIG. 22 shows a cross-sectional view of an embodiment of a hexagonal truncated pyramid TFSC with a thick planar peripheral silicon frame.

FIG. 22 shows an embodiment similar to the one in FIG. 21, but with a thick silicon frame 1801 in place of thin frame 1701. The TFSC of FIG. 22 has not yet had metallization applied.

Figure 23:
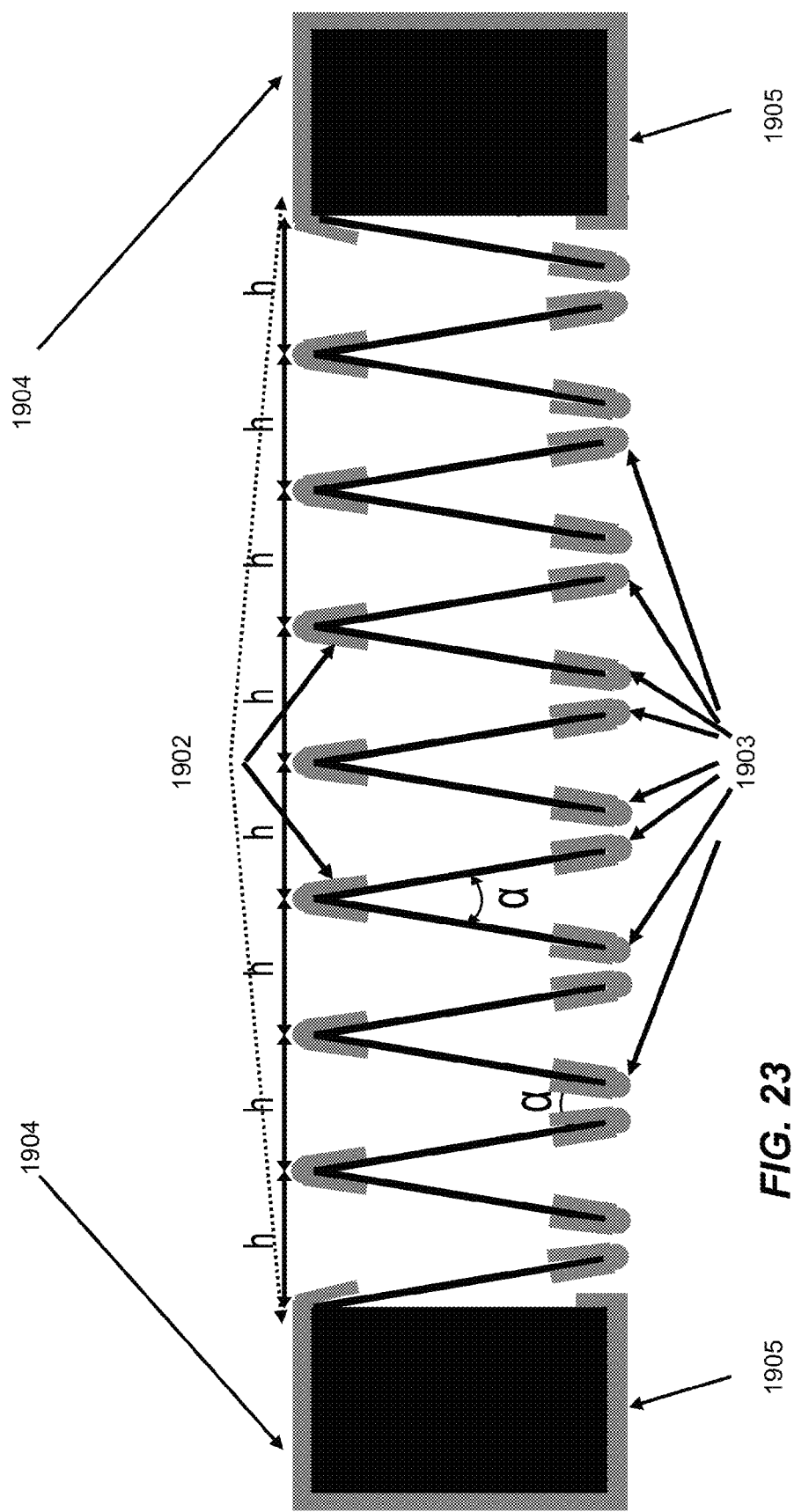
FIG. 23 shows a cross-sectional view of an embodiment of a hexagonal truncated pyramid TFSC with a thick planar peripheral silicon frame and self-aligned base and emitter contacts.

FIG. 23 shows an embodiment similar to the one in FIG. 22, but after self-aligned front side base contacts and back side emitter contacts have been applied. The unit cells in FIG. 23 have had metallized contacts applied on both the front and back sides. Front side self-aligned base contacts 1902 cover substantially all of the hexagonal ridges making up the front of the substrate and are, in some embodiments, silver, aluminum, or some other metal. They may be formed by, for example, fire-through metallization or by plating. Front side contacts 1902 may form an interconnected hexagonal contact pattern throughout the entire substrate, because the top ridges may be in electrical contact with one another. Self-aligned back side emitter contacts 1903 may cover substantially all of the isolated hexagonal ridges making up the back side of the substrate. The back side hexagonal ridges may be isolated from one another, because the smaller back side bottom apertures do not form a continuous grid. Contacts 1903 may be made of silver, aluminum, or some other metal; they may also be formed by fire-through metallization or by plating. The front side contacts 1902 are connected to frame-edge front side contact 1904. Frame-edge front side contact 1904 may also be connected to frame-edge back side contact 1905 through either a wrap-around or a wrap-through connection. This connection between contact 1904 and contact 1905 may allow for simpler automation of solar module assembly. The TFSC of FIG. 23 may be square or rectangular with dimensions of about 150 mm to more than 200 mm.

Figure 24:
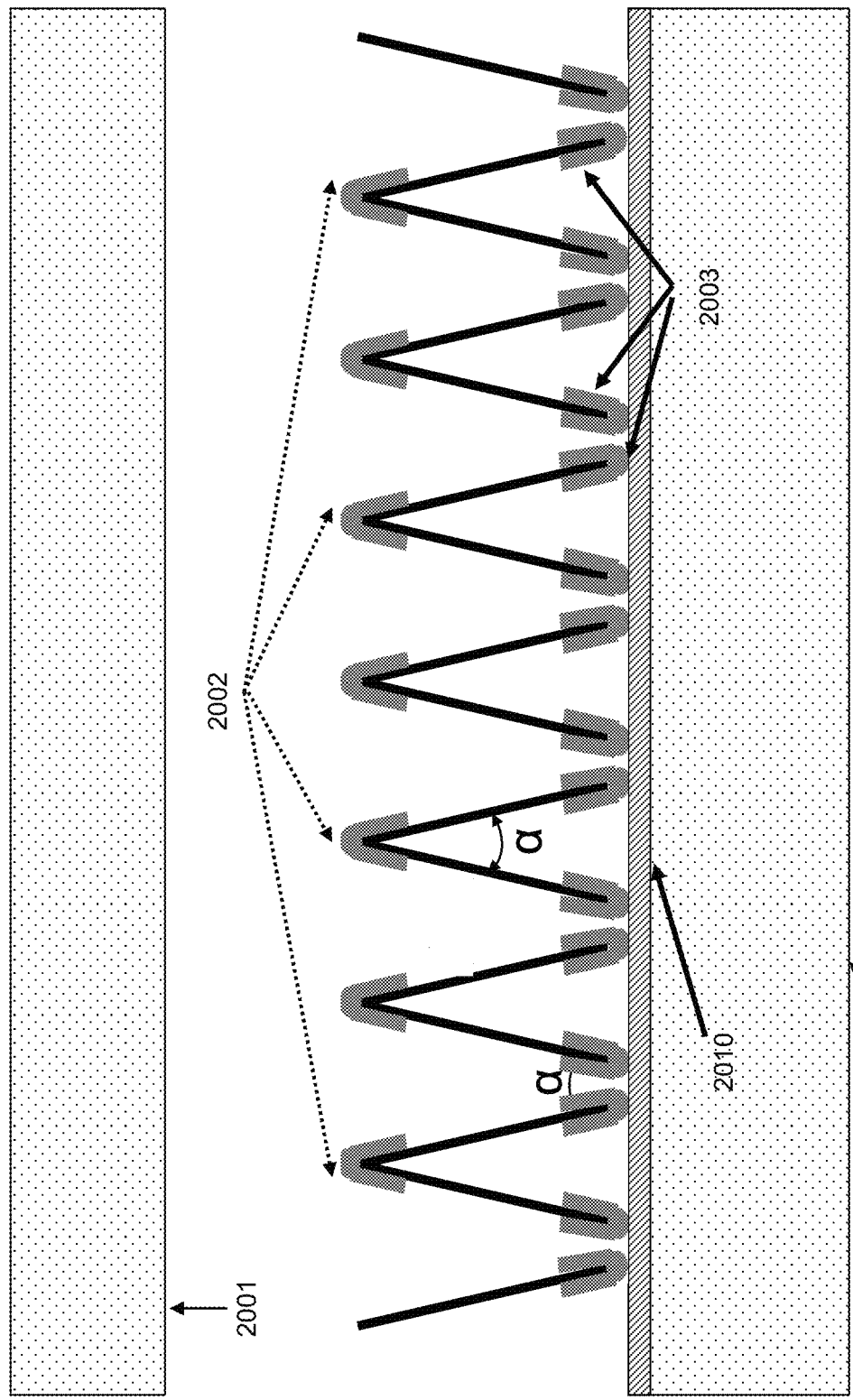
FIG. 24 shows a cross-sectional view of an embodiment of a solar glass application of a hexagonal truncated pyramid TFSC.

FIG. 24 shows a cross section along the YY plane of an embodiment of a 3-D TFSC in a solar glass application. Top window glass plate 2001 faces away from the building on which the solar glass is mounted and towards the incoming sunlight. Self-aligned front side base interconnects 2002 form a substantially continuous grid of metallization, which connects to the silicon frame at the edge of the cell (not shown). Self-aligned back side emitter contacts 2003 are in electrical contact with an electrically conductive semitransparent layer 2010. Layer 2010 may include single or multiple layers of silver and/or metal oxide (e.g., indium tin oxide). Bottom window glass plate 2011 faces the inside of the building. The distance between top window glass plate 2001 and layer 2010 may be between approximately 6 mm and 12 mm. The space between top window glass plate 2001 and layer 2010 may be filled with, e.g., argon gas. By varying the parameters of the shape of the truncated pyramid unit cells, one may design the solar glass of FIG. 24 to have a desired transmissivity (e.g., from approximately 10% to approximately 90%).

Figure 25:
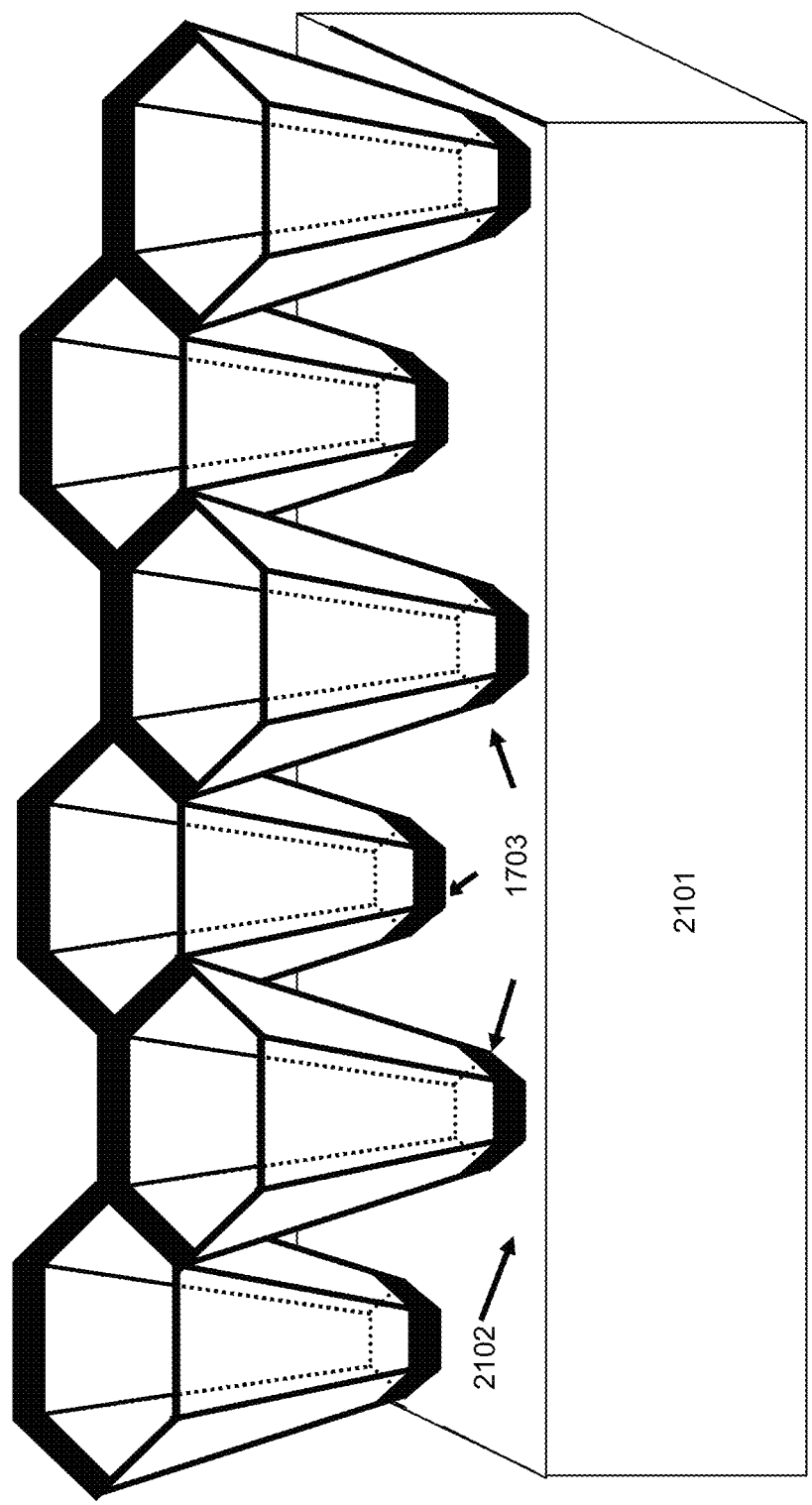
FIG. 25 shows an isometric view of a section of an embodiment of a hexagonal truncated pyramid TFSC mounted on a glass substrate.

FIG. 25 shows a view of a section of an embodiment of a partially transparent 3-D TFSC, before the application of top window glass plate 2001. A plurality of unit cells 300 are attached to a substrate 2101, which may be made of glass. In particular, rear emitter contacts 1703 may be either soldered or glued to glass substrate 2101. Glass substrate 2101 may have a thin conductive layer 2102 of, for example, silver or a transparent conductive oxide, to which rear emitter contacts 1703 may be attached. This may allow the entire solar module to be partially transparent while providing an electrical connection to all of the rear emitter contacts.

In a similar embodiment, glass substrate 2101 may be replaced with a metallic substrate, with either a rough or a specular mirror surface. This metallic substrate may serve as a light diffuser and reflector, as well as the back side interconnect plane for the rear emitter contacts 1703.

Figure 26:
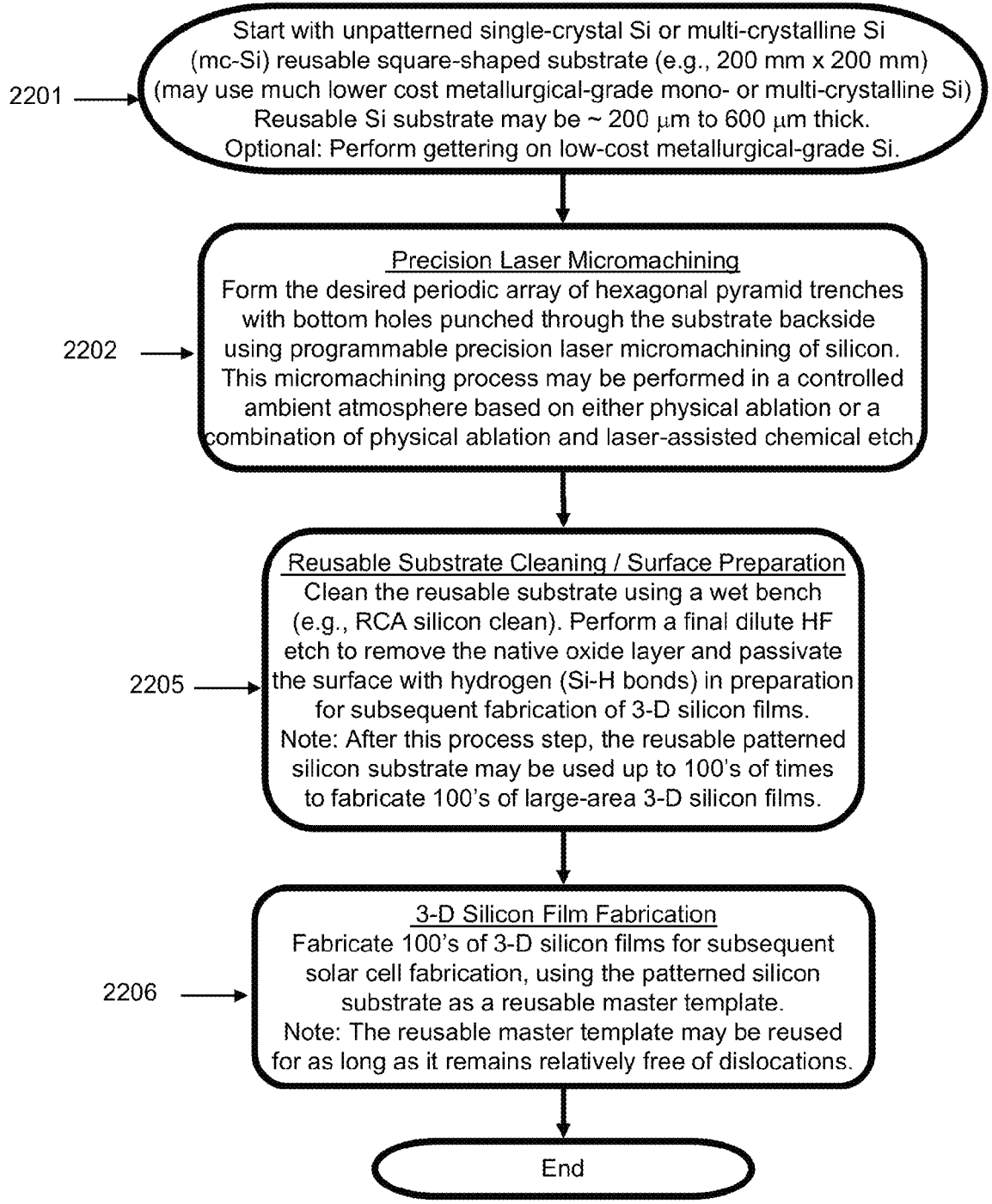
FIGS. 26-27 show embodiments of process flows for patterning a reusable silicon substrate.
Figure 27:
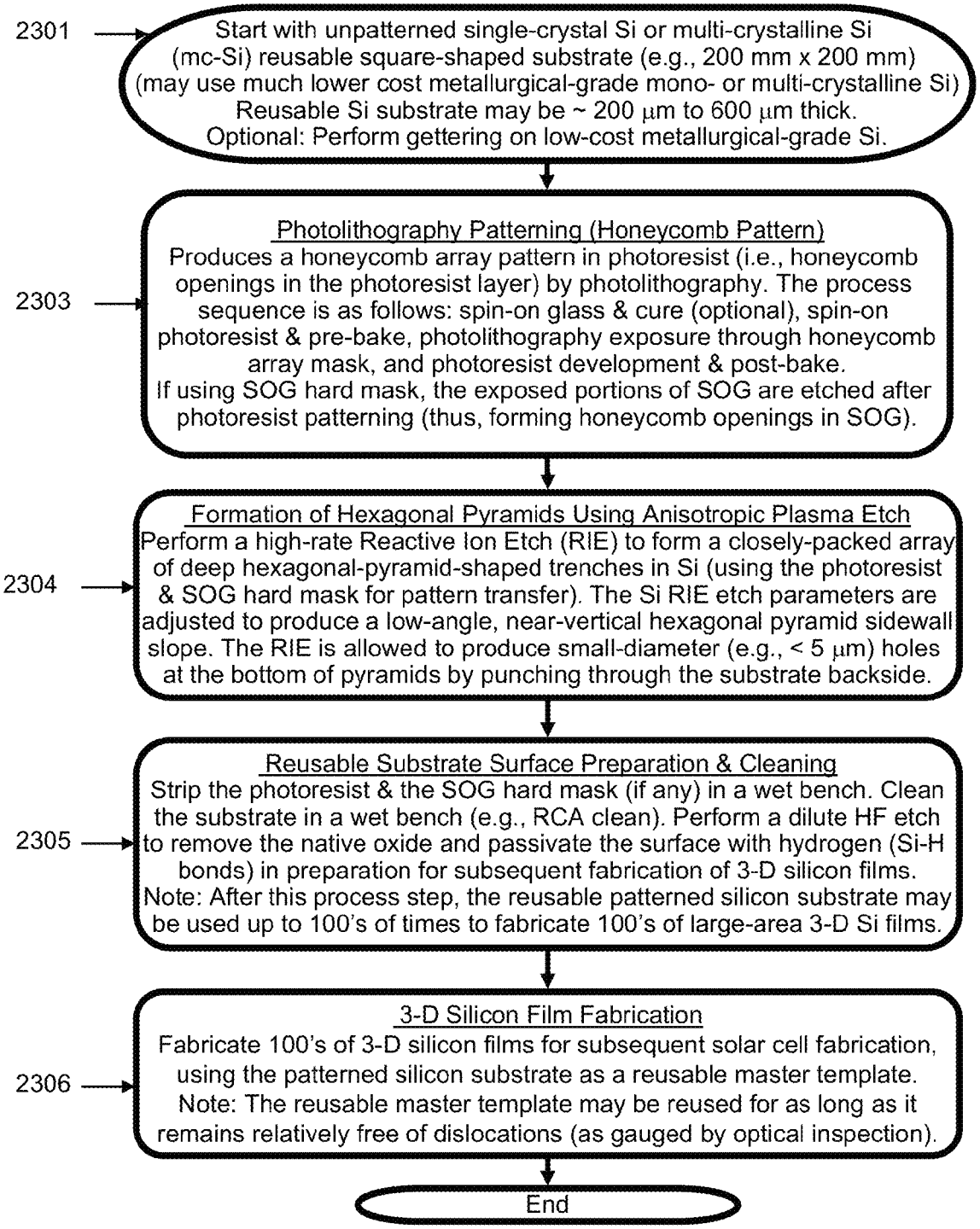

FIGS. 26 and 27 show two embodiments of process flows for patterning a reusable silicon substrate template, for use in producing 3-D TFSCs. The process flow of FIG. 26 uses direct laser micromachining to produce the surface structures of the reusable substrate template. At step 2201, a square, unpatterned substrate of single-crystal or multi-crystalline silicon is used. The silicon may be low-cost metallurgical-grade silicon. The unpatterned substrate may be about 200 mm×200 mm, and it may be about 200 to 600 microns in thickness. Optional gettering may be performed on the substrate to reduce the effects of impurities.

In step 2202, a laser is used to form the micromachined patterns. A laser-assisted chemical etch may optionally be used in combination with the physical laser ablation. Then in step 2205, the reusable substrate is cleaned by, for example, RCA cleaning. A final etch with dilute hydrofluoric acid may remove the native oxide layer and passivate the surface with Si—H bonds. The reusable substrate may then be used for fabrication of hundreds of 3-D TFSCs, as discussed in connection with FIGS. 28-31.

FIG. 27 describes an alternate process flow for patterning a reusable silicon substrate using photolithography. In this embodiment, the same low-cost metallurgical grade silicon may be used. In step 2303, a spin-on glass hard mask layer is optionally applied to the substrate and cured, and then photoresist is applied. The photoresist is exposed through an array mask having the desired shapes for the 3-D structures to be created, and then developed. If the optional spin-on glass has been applied, it must also then be etched to expose the substrate. In step 2304, reactive ion etching is used to pattern the trenches into the substrate. In step 2305, the photoresist and optional spin-on glass hard layer are stripped in a wet bench. Then the substrate is cleaned and passivated as in FIG. 27.

Figure 28:
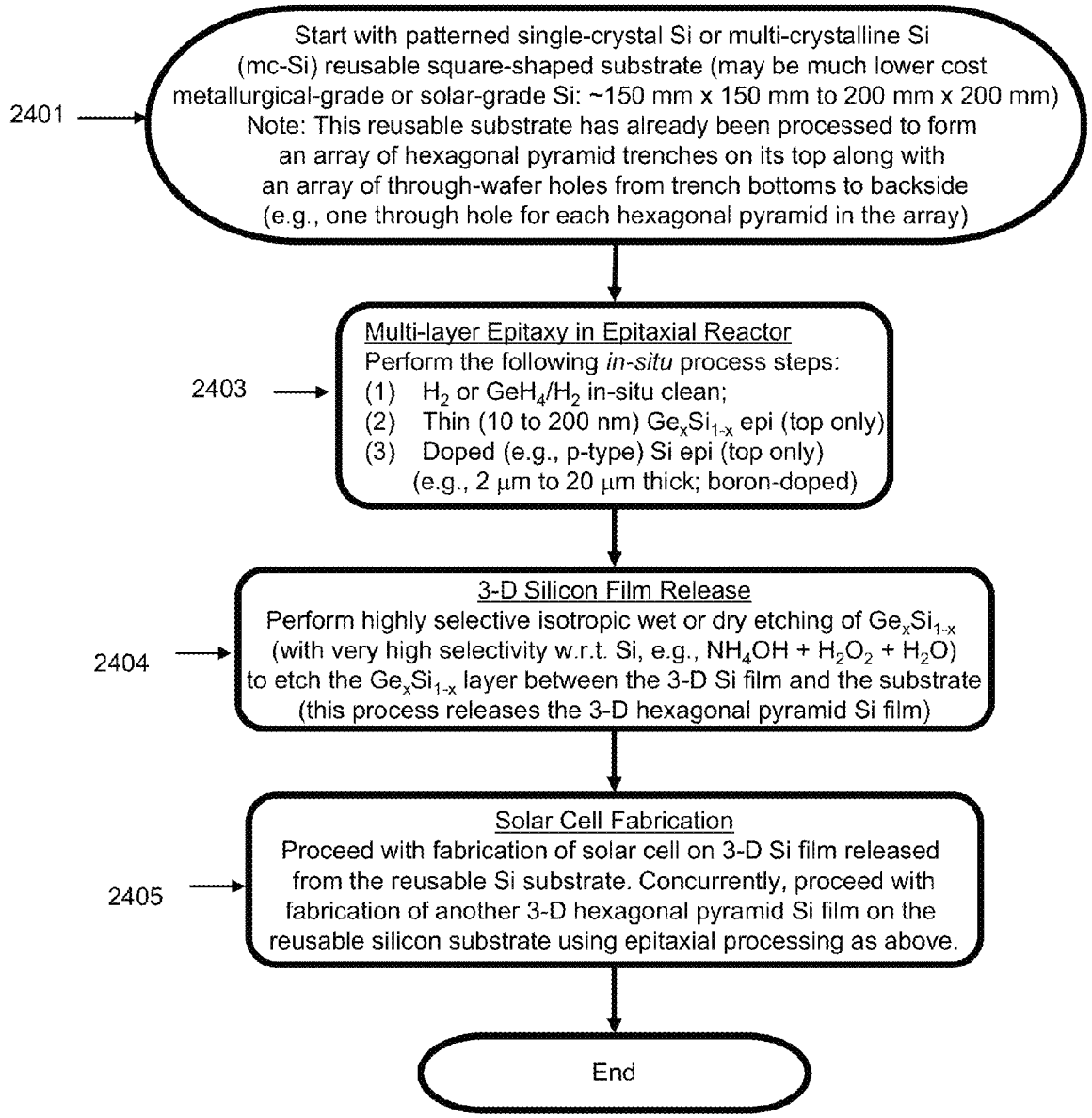
FIGS. 28-31 show embodiments of process flows for fabricating self-supporting 3-D TFSCs.

FIGS. 28-31 show embodiments of some process flows for creating self-supported 3-D TFSCs from reusable silicon substrates such as the ones that may be made by the processes of FIGS. 27 and 28, by using layer release processing techniques.

In FIG. 28, the process begins at step 2401 with a patterned reusable substrate. Multi-layer epitaxy is performed at step 2403. Then a highly selective isotropic etch process is performed at step 2404 to release the newly formed silicon film.

Figure 29:
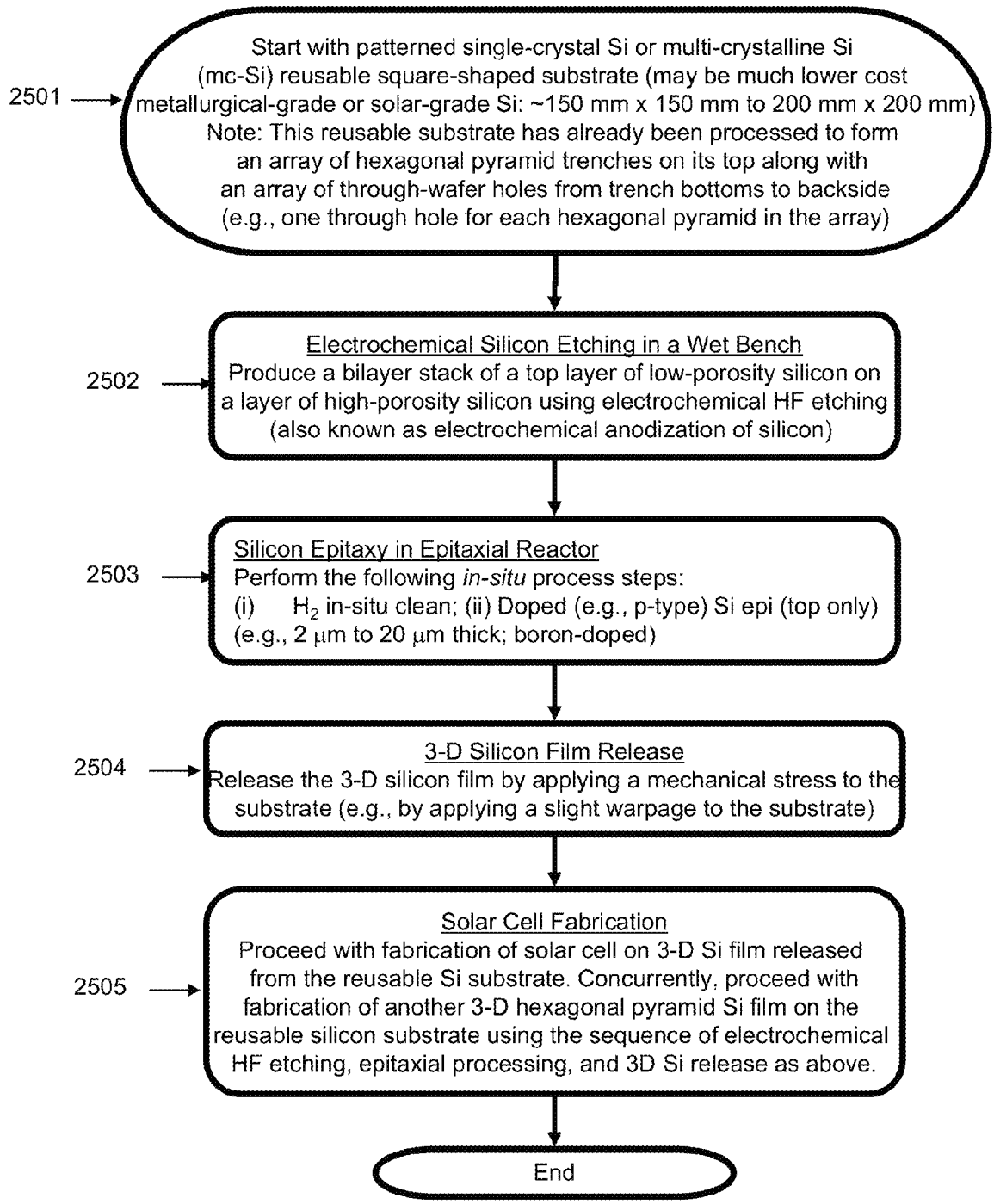

In FIG. 29, there is an initial HF electrochemical etching in a wet bench at step 2502. This produces a bilayer stack of porous silicon with two different porosities. Then epitaxy is performed in step 2503, and the film is released by applying mechanical stress to the substrate.

Figure 30:
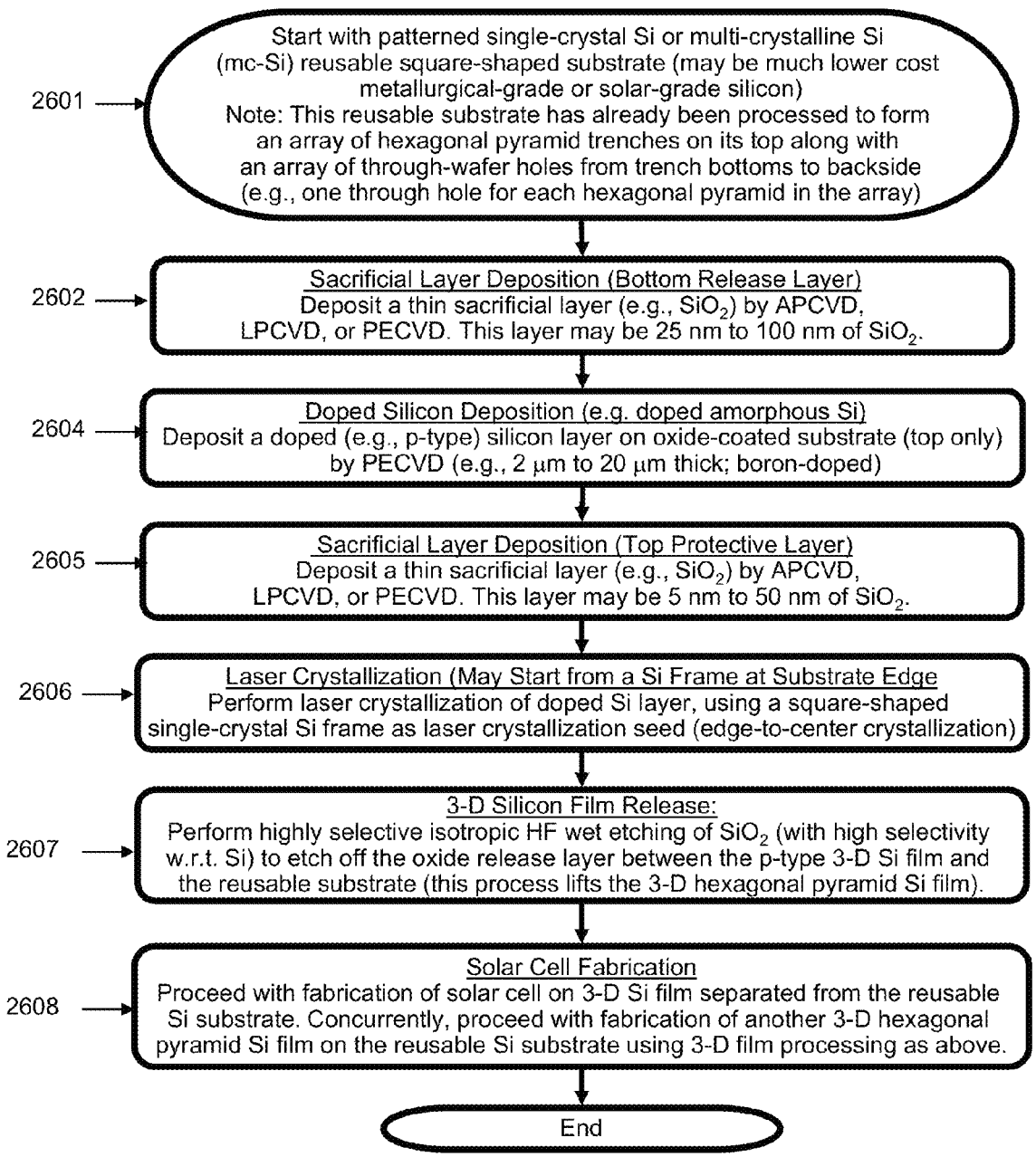

In FIG. 30, a thin bottom sacrificial release layer (e.g., $SiO_2$) is first deposited on the reusable substrate at step 2602. The bottom sacrificial release layer may be formed by atmospheric pressure chemical vapor deposition (APCVD), low pressure chemical vapor deposition (LPCVD), or plasma enhanced chemical vapor deposition (PECVD). Then a doped silicon layer is deposited by PECVD in step 2604. Another sacrificial layer, this time a top protective layer, is deposited in step 2605. At step 2606, the doped silicon layer is laser crystallized using a single-crystal silicon frame as the seed crystal. Finally, the silicon film is released by highly selective isotropic HF wet etching at step 2607.

Figure 31:
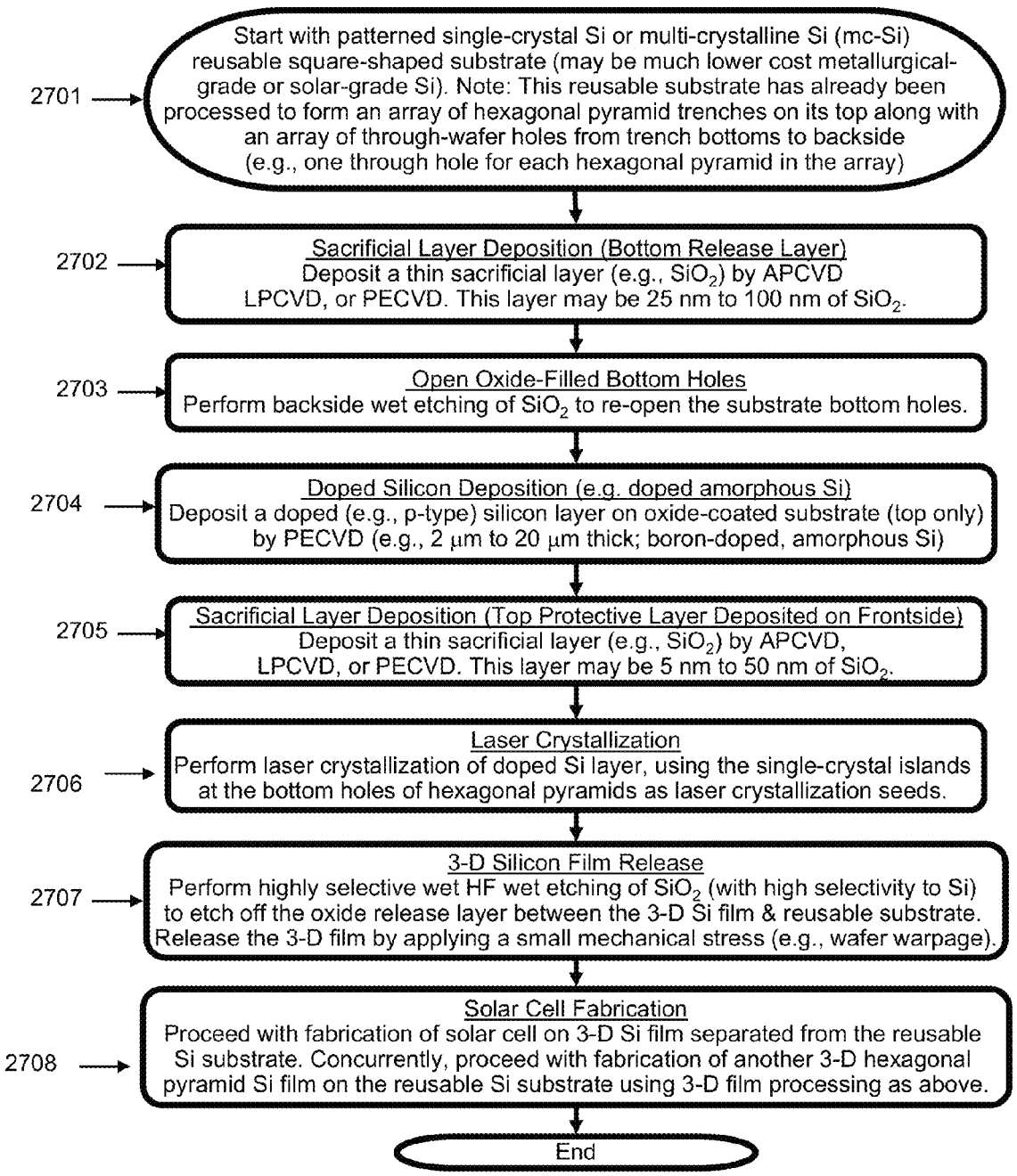

The process flow in FIG. 31 differs in that in step 2703, the bottom holes of the reusable substrate's bottom holes. Then the laser crystallization proceeds in step 2706 by using the single-crystal islands at the bottoms of the pyramids as seed crystals.

FIGS. 32-39 show embodiments of some process flows for doping and metallizing 3-D TFSCs, such as the ones made by the process flows of FIGS. 28-31.

Figure 32:
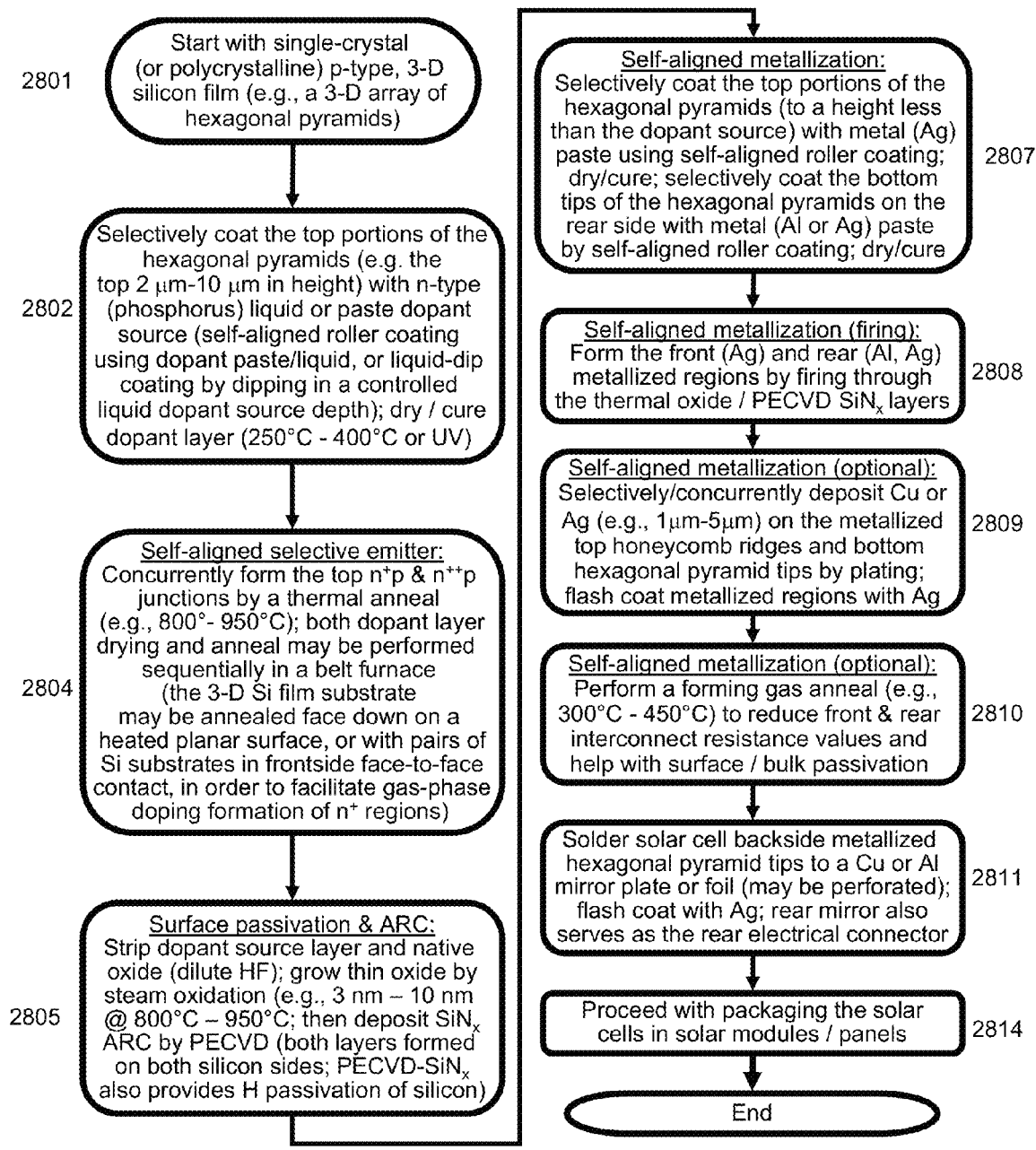
FIGS. 32-39 show embodiments of process flows for doping and metallizing self-supporting 3-D TFSCs.

In FIG. 32, start at step 2801 with a 3-D TFSC such as one produced by the preceding processes. At step 2802, the tops of the pyramids (hexagonal in this embodiment) are coated with n-type dopant, which is then cured. The self-aligned selective emitter is formed at step 2804 by annealing the dopant layer. At step 2805, the dopant source and native oxide layer are stripped in dilute HF, a thin new oxide layer is formed, and a $SiN_x$ anti-reflective coating layer is applied. At step 2807, both sides of the pyramids are coated with metal paste, which is then cured; at step 2808, this is then fired through the oxide and $SiN_x$ layers to form the metallization. Optional step 2809 adds either copper or silver plating to the already-formed metallization, and optional step 2810 provides a forming gas anneal to reduce resistance and help with passivation. At step 2811, the back side of the cell is connected to a mirror, which also serves as the back side electrical contact; the cell is then ready to be packaged into solar modules at step 2814.

Figure 33:
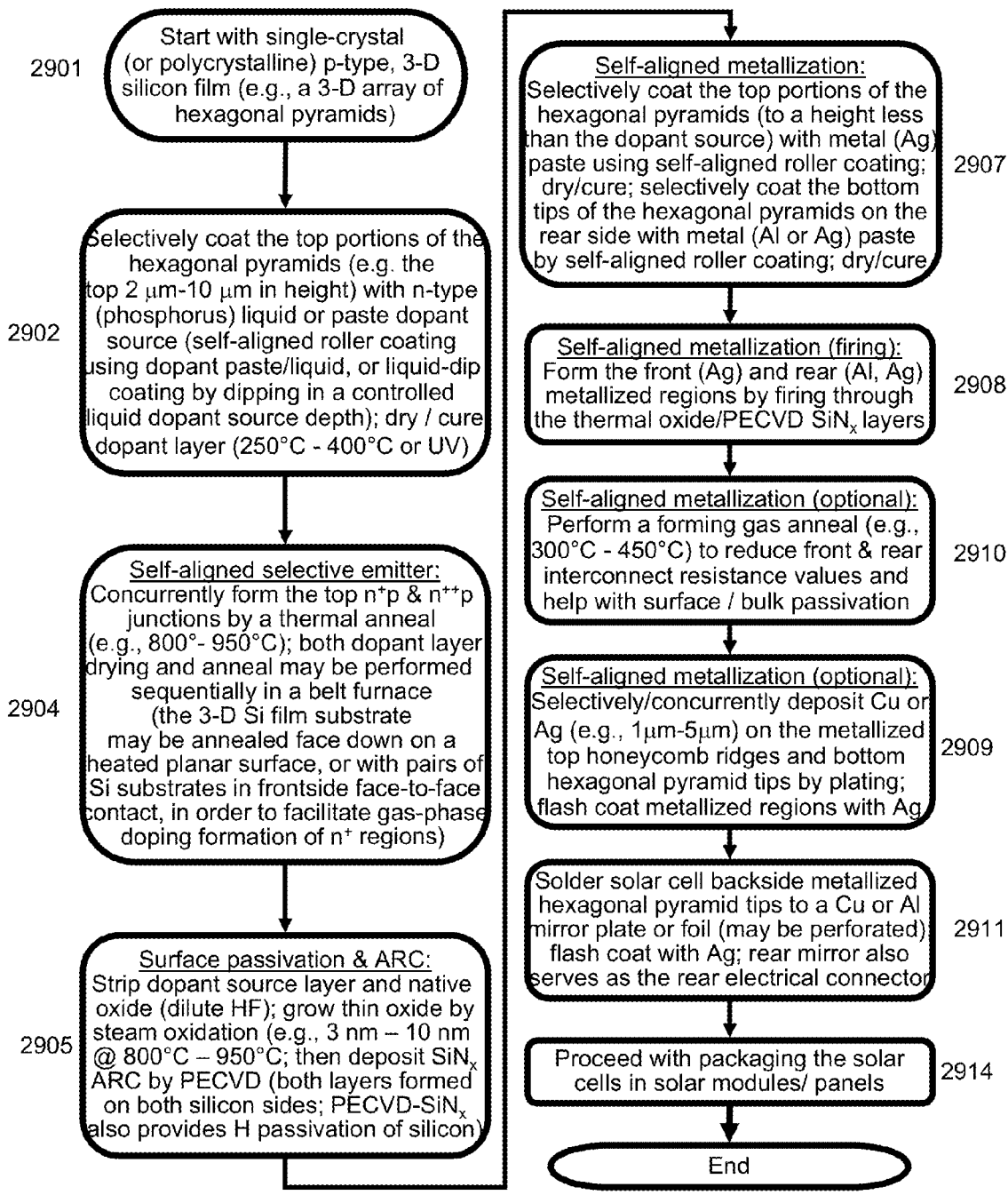

FIG. 33 provides an embodiment similar to the one shown in FIG. 32. In FIG. 33, however, the forming gas anneal takes place before the copper/silver plating step instead of after.

Figure 34:
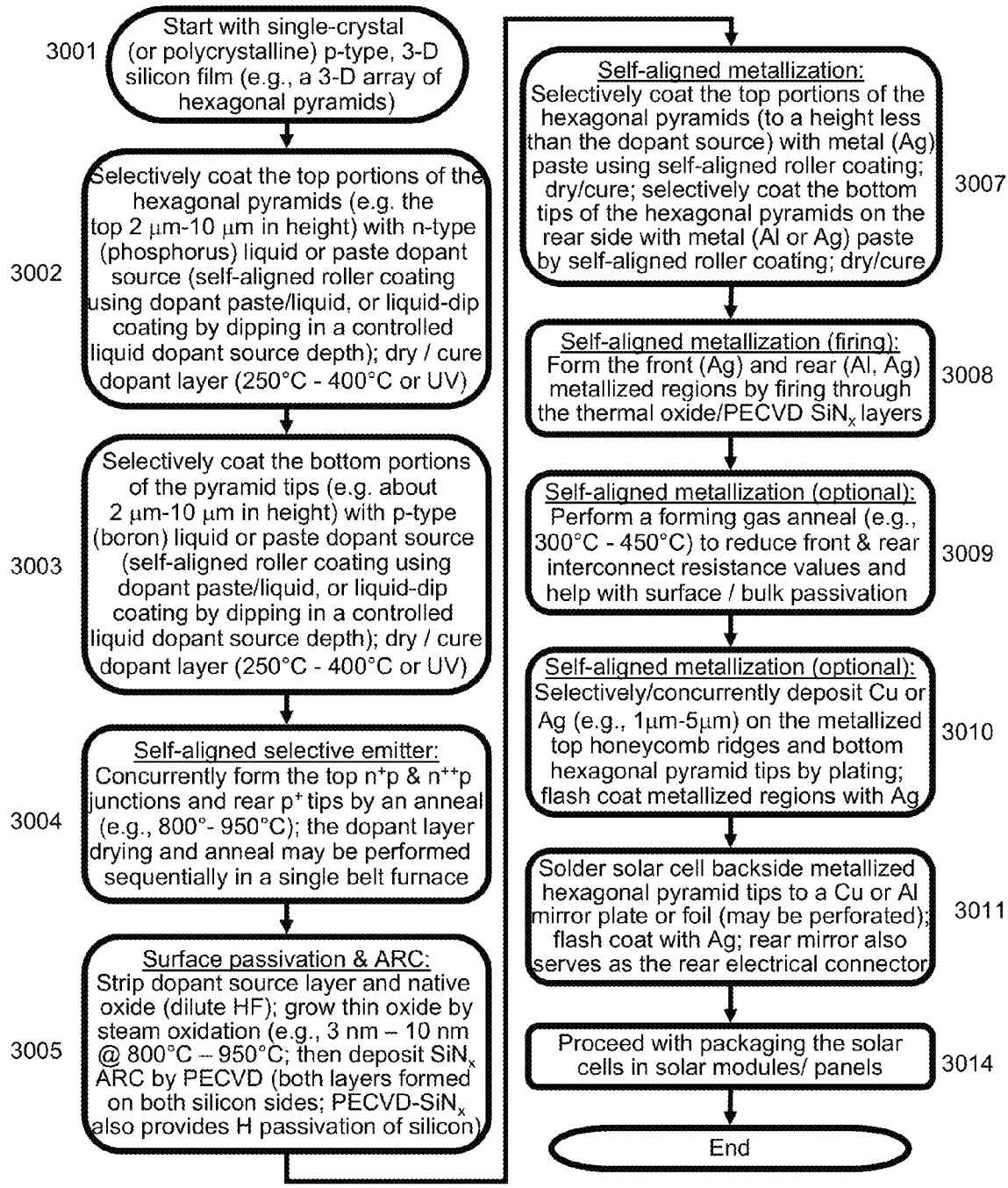

FIG. 34 provides a similar embodiment to the one shown in FIG. 32. In FIG. 34, however, at step 3003, the bottoms of the pyramids are coated with p-type dopant to form $p^+$ doping on the rear tips during the annealing at step 3004.

Figure 35:
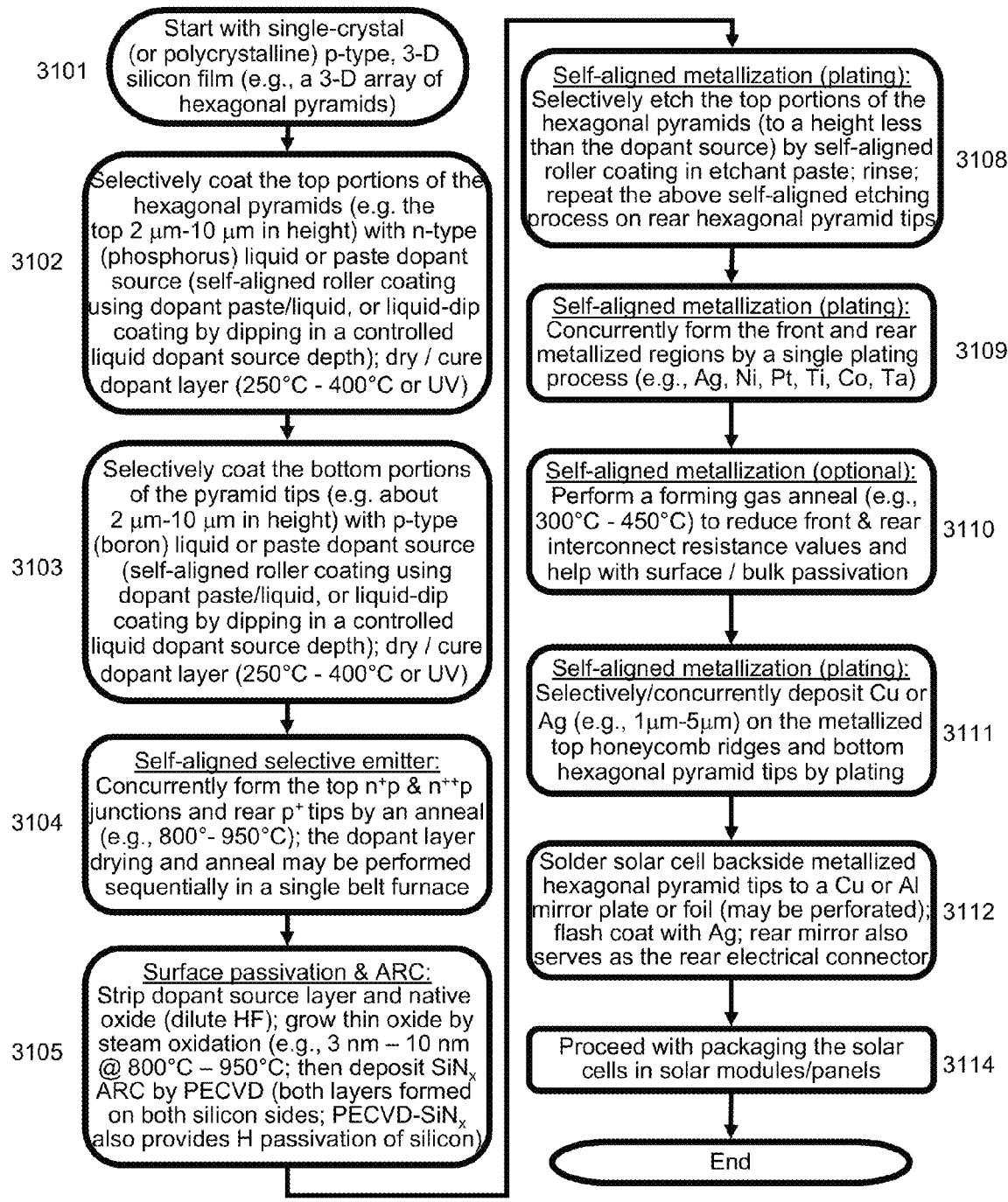

FIG. 35 provides a similar embodiment to the one shown in FIG. 34, but with a different method of metallization. After the anti-reflective coating is applied at step 3105, the front ridges and rear tips of the pyramids are etched at step 3108. Then the front and rear metallized regions are formed by plating at step 3109. After an optional forming gas anneal at step 3110, either copper or silver is plated onto the metallized regions on the front and the back of the cell at step 3111.

Figure 36:
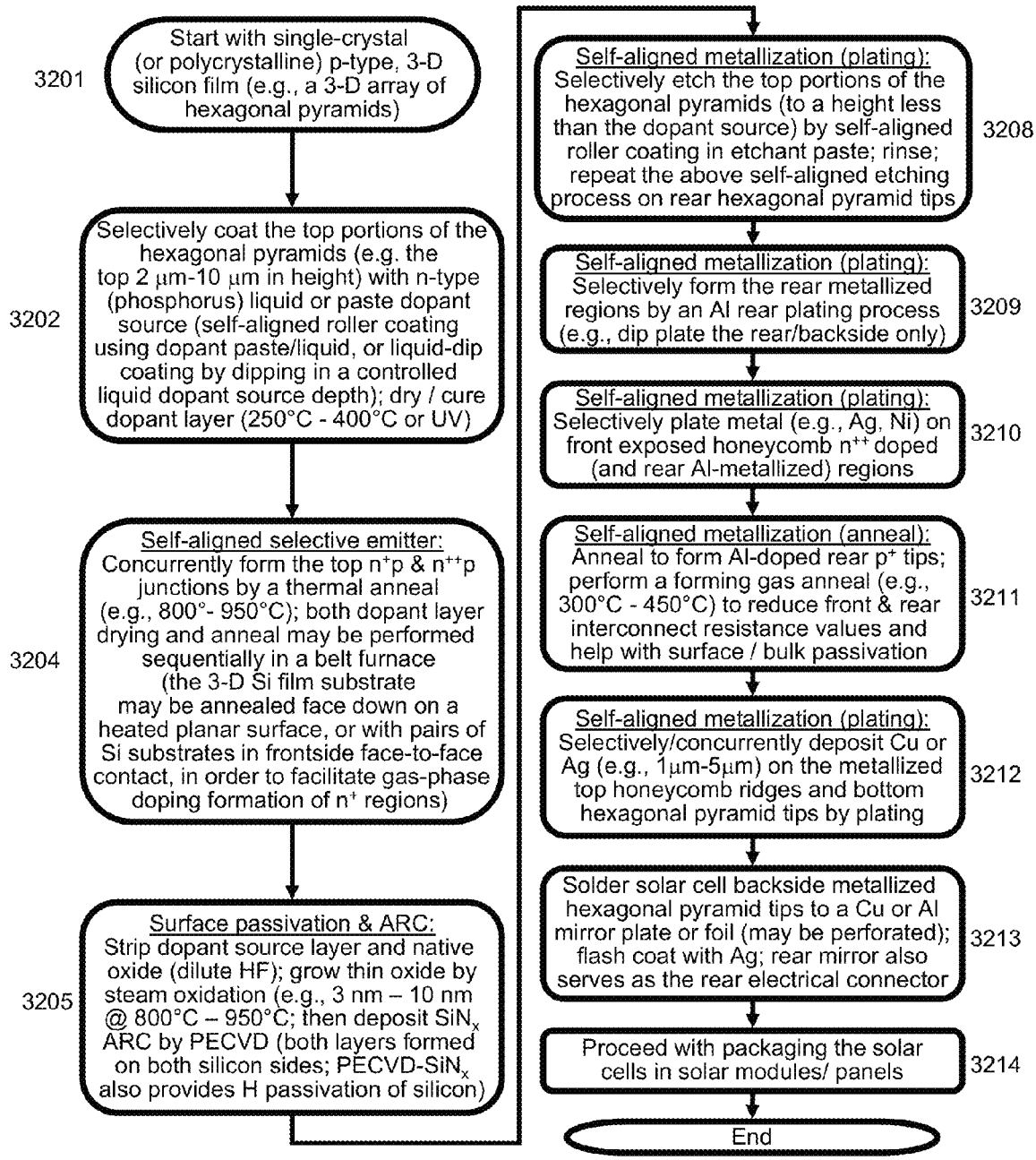

FIG. 36 provides a similar embodiment to the one shown in FIG. 34, but without rear side boron $p^+$ doping. After the etching in step 3208, the rear side only is plated with aluminum at step 3209, and then both sides are plated at step 3210. The cell is annealed at step 3211 to form aluminum-doped rear tips, and to reduce resistance and passivate. After annealing, either copper or silver may be deposited on the metallized front and back surfaces at step 3212.

Figure 37:
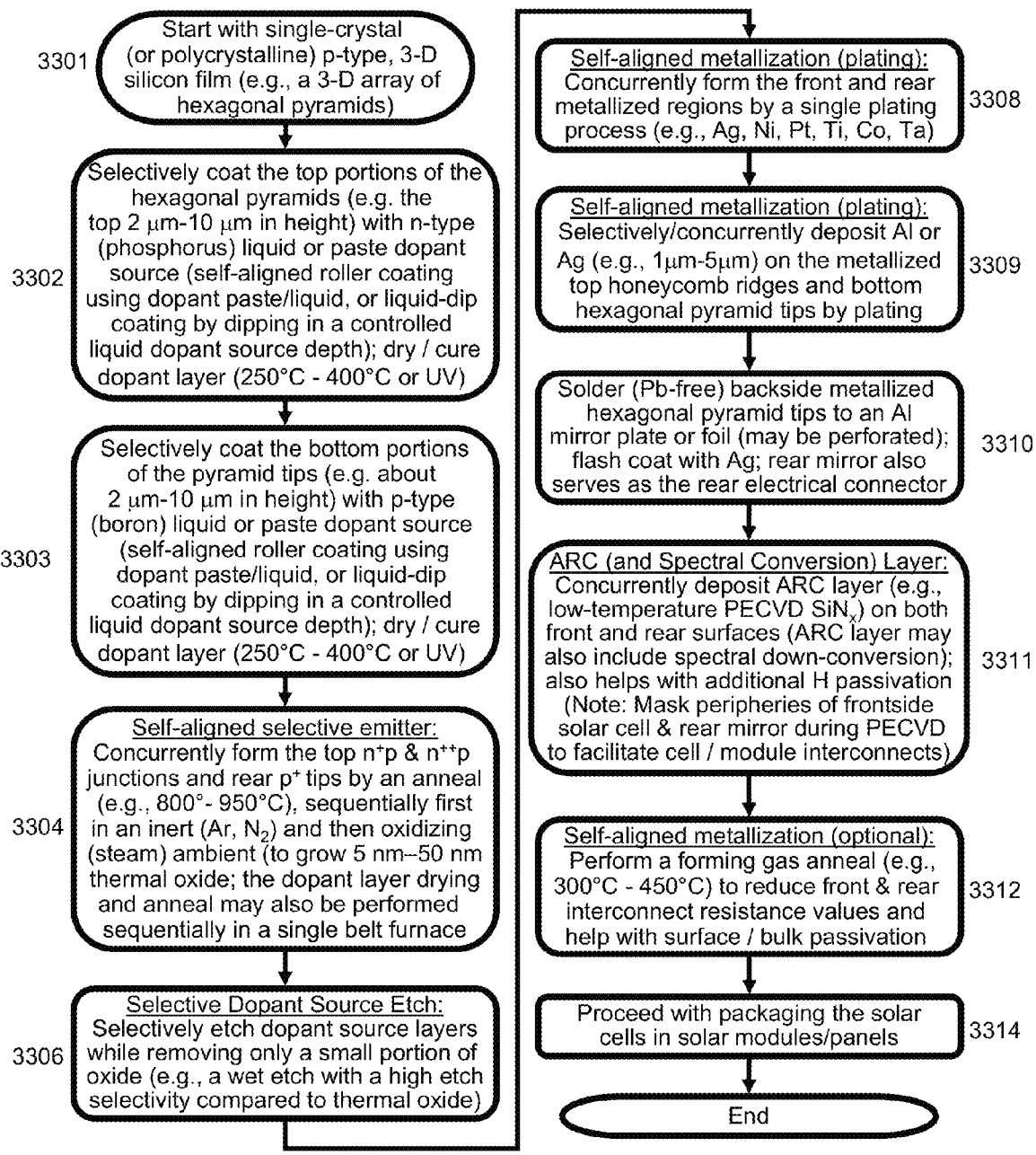

FIG. 37 shows a different embodiment of a process flow for doping and metallizing a 3-D TFSC. As in the other embodiments, we start at step 3301 with a 3-D TFSC such as one produced by the preceding processes. At steps 3302 and 3303, respectively, the top and bottom portions of the pyramids are coated with dopant, which is then cured. The doped regions are then annealed at step 3304, first in an inert gas, then in oxidizing steam. The dopant source and a small amount of oxide are then removed by etching at step 3306. At step 3308, the front and rear metallized regions are formed in a single plating process. Then at step 3309, aluminum or silver may be plated onto the metallized top ridges and rear tips. At step 3310, the cell back side is soldered onto a mirror, which also serves as an electrical connector. An anti-reflective layer is deposited on both the front and the back surfaces at step 3311, and finally an optional forming gas anneal is performed at step 3312.

Figure 38:
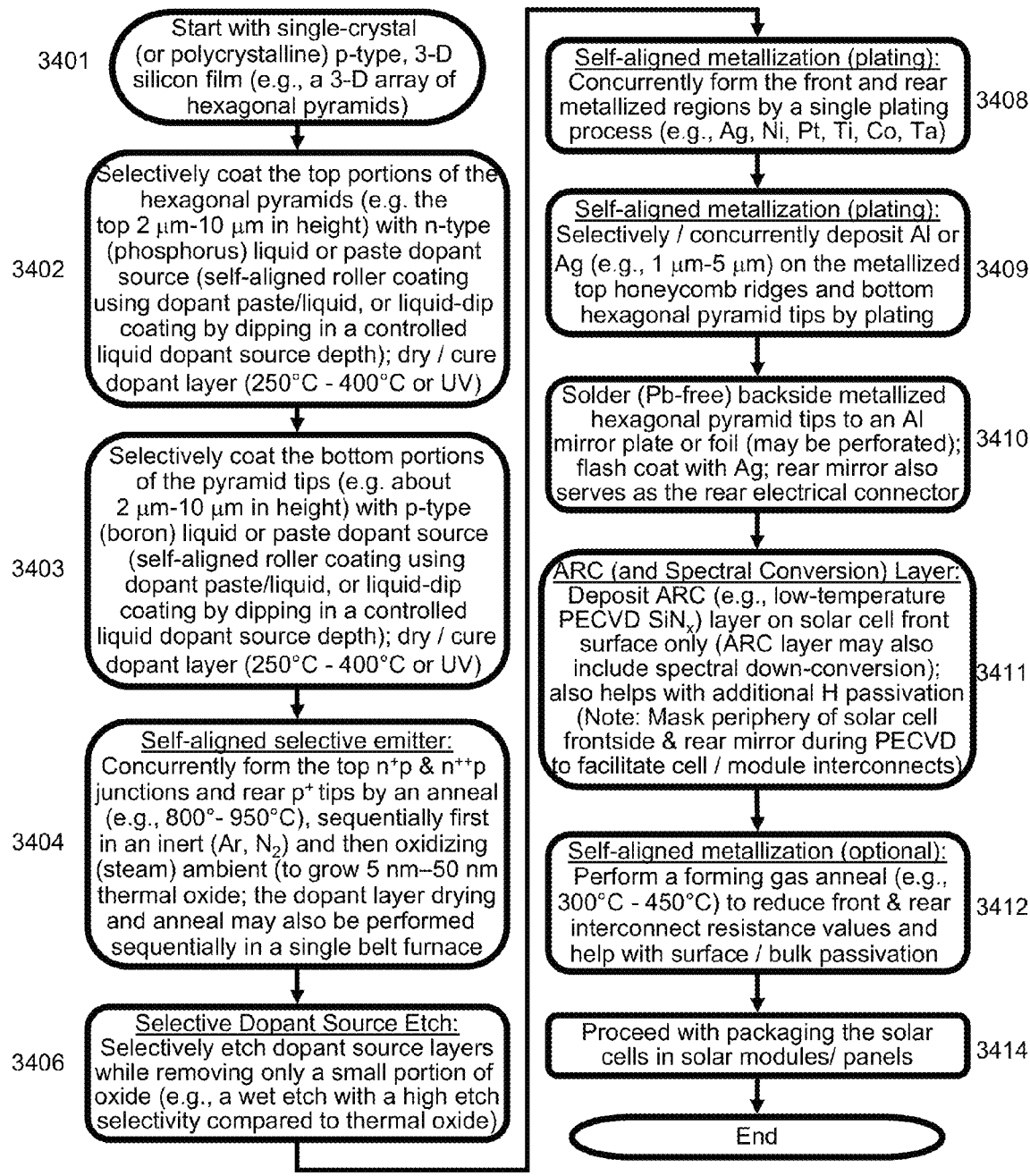

FIG. 38 provides an embodiment similar to the one shown in FIG. 37. In FIG. 38, however, at step 3411, the anti-reflective coating is applied only to the front surface of the cell, rather than to both surfaces concurrently.

Figure 39:
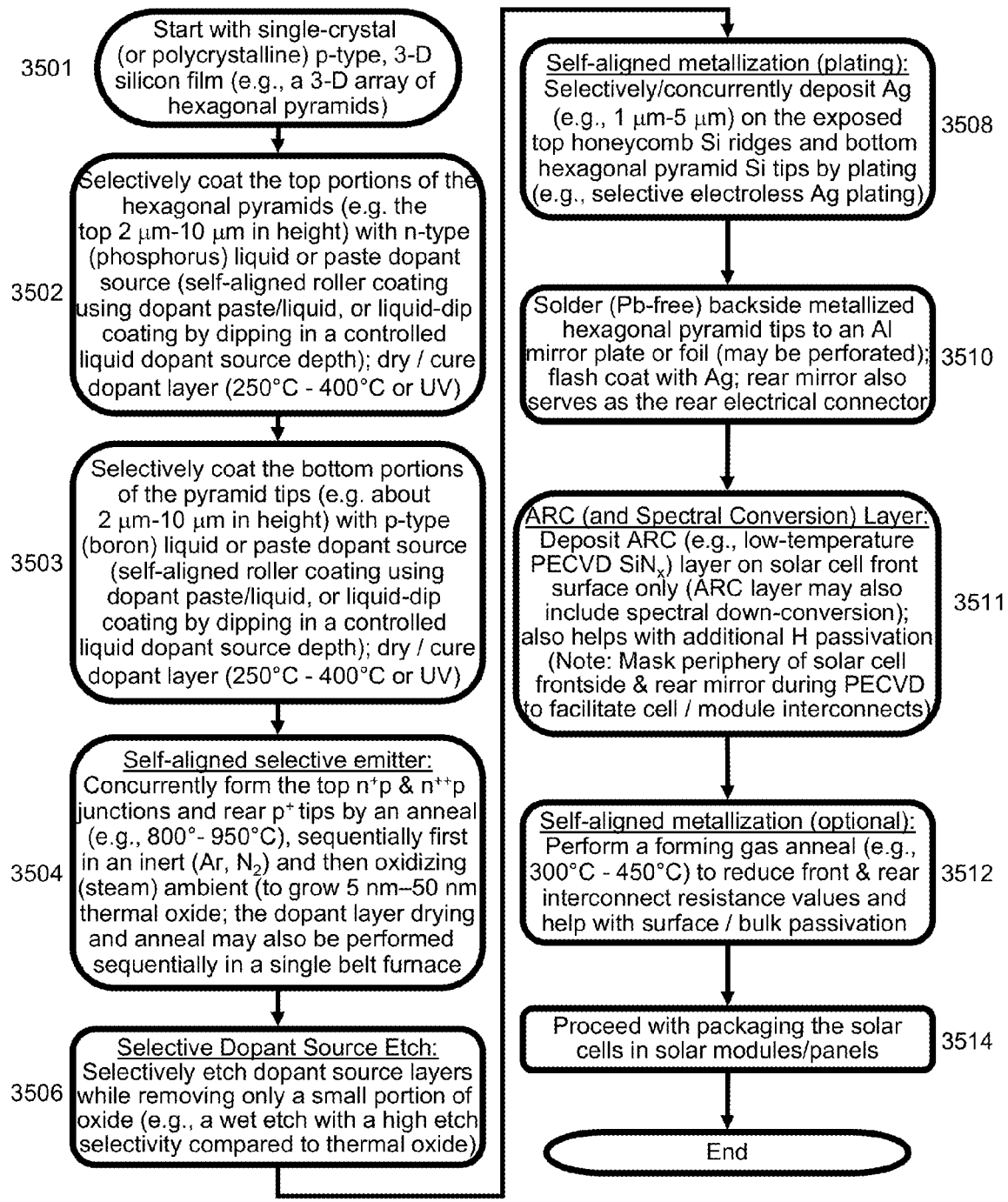

FIG. 39 provides an embodiment similar to the one shown in FIG. 38. However, the two plating steps 3408 and 3409 have been replaced by a single silver plating step 3508.

Figure 40:
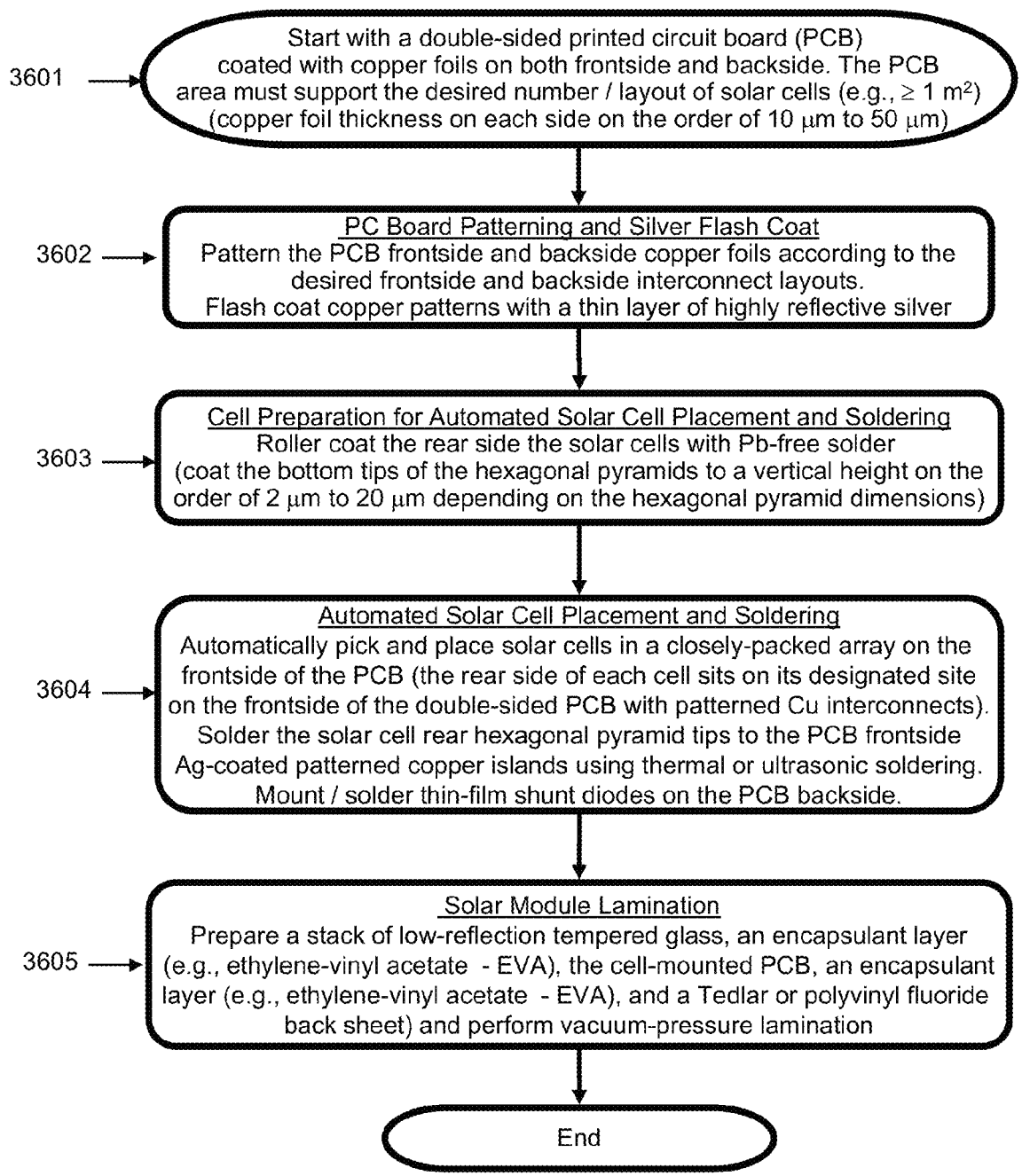
FIGS. 40-41 show embodiments of process flows for fabricating solar panels.
Figure 41:
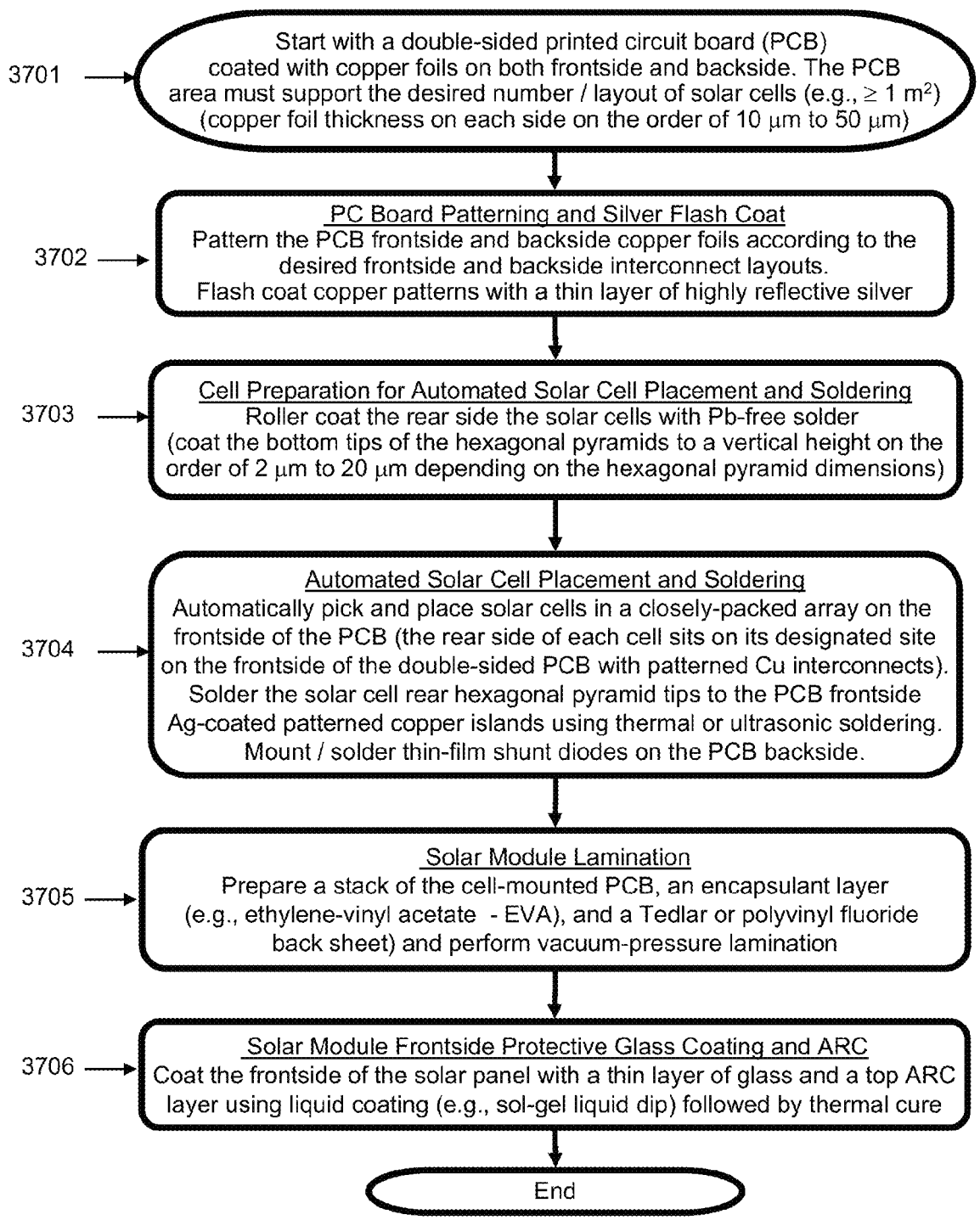

FIGS. 40 and 41 show two embodiments of process flows for fabricating solar panels from the 3-D TFSCs of the present disclosure. In FIG. 40, begin with a PCB coated on both sides with copper foil at step 3601. The copper is then patterned with interconnects, and then flash coated with reflective silver at step 3602. The TFSCs are prepared and soldered in place at steps 3603 and 3604. Finally, the PCB is laminated in a stack with glass, an encapsulant, the PCB itself, another encapsulant and a back sheet at step 3605.

FIG. 41 is similar to the process flow shown in FIG. 40 up through step 3704. It differs in that the lamination at step 3705 omits the glass and first encapsulant layer. Then at step 3706, the front side of the panel may be coated with a thin layer of glass and an anti-reflective coating.

The foregoing description of embodiments is provided to enable a person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for making a see-through three-dimensional monocrystalline silicon thin film solar cell substrate, comprising the steps of:
    patterning a reusable monocrystalline silicon template;
    forming a sacrificial porous silicon release layer on a surface of said reusable monocrystalline silicon template;
    depositing a doped monocrystalline silicon film onto said sacrificial porous silicon release layer, said doped monocrystalline silicon film being substantially conformal to said sacrificial porous silicon release layer and having a thickness in the range of 2 to 50 microns for forming a three-dimensional monocrystalline silicon thin film solar cell substrate and having a three-dimensional topography corresponding to said patterned reusable monocrystalline silicon template and comprising:
        a plurality of discrete and isolated inverted pyramidal cavities at predetermined locations on said three-dimensional monocrystalline silicon thin-film solar cell substrate each comprising a pyramidal tip and tapered sidewalls, said plurality of discrete and isolated inverted pyramidal cavities having a pyramidal cavity height in the range of approximately 100 to 400 microns on a front surface of said three-dimensional monocrystalline silicon thin-film solar cell substrate, said plurality of discrete and isolated inverted pyramidal cavities having central axes substantially perpendicular to said front surface of said three-dimensional monocrystalline silicon thin-film solar cell substrate and having a ratio between height and side dimensions ranging from approximately 1.5 to 3; and
        a plurality of interconnected continuous ridges interspersed among and bordering said plurality of discrete and isolated inverted pyramidal cavities and associated to construct said monocrystalline silicon thin-film solar cell substrate as a free-standing, self-supporting substrate, and further having a ridge width ranging from approximately 0.5 to 5 microns on said front surface of said three-dimensional monocrystalline silicon thin-film solar cell substrate, wherein
    said three-dimensional monocrystalline silicon thin-film solar cell substrate, said plurality of discrete and isolated inverted pyramidal cavities, and said plurality of interconnected continuous ridges cooperate to enable a free-standing, self-supporting three-dimensional monocrystalline silicon thin-film solar cell with sufficient mechanical rigidity and resilience for reduced cell breakage rate in a solar cell production factory;
    detaching said three-dimensional monocrystalline silicon thin-film solar cell substrate from said reusable monocrystalline silicon template through separation at said sacrificial porous silicon release layer; and
    selectively removing a predetermined portion of a plurality of said pyramidal tips from said plurality of discrete and isolated inverted pyramidal cavities to create a plurality of see-through holes of specified opening area.

2. The method of claim 1, wherein:
    said plurality of discrete and isolated inverted pyramidal cavities comprise hexagonal pyramidal cavities.

3. The method of claim 1, wherein:
    said pyramidal cavities comprise quadrilateral plurality of discrete and isolated inverted pyramidal cavities.

4. The method of claim 1, wherein:
    said pyramidal cavities comprise triangular plurality of discrete and isolated inverted pyramidal cavities.

5. The method of claim 1, wherein said patterning step comprises laser micromachining.

6. The method of claim 1, wherein said patterning step comprises photolithography and reactive ion etching.

7. The method of claim 1, wherein said sacrificial porous silicon release layer comprises a first layer having a first porosity and a second layer having a second porosity.

8. The method of claim 1, wherein said step of detaching said three-dimensional monocrystalline silicon thin-film solar cell substrate from said reusable monocrystalline silicon template comprises:
    mechanically separating said three-dimensional monocrystalline silicon thin film from said sacrificial layer.

9. The method of claim 1, wherein said step of detaching said three-dimensional monocrystalline silicon thin-film solar cell substrate from said reusable monocrystalline silicon template comprises:
    chemically etching said sacrificial porous silicon release layer.

10. The method of claim 1, further comprising a step of forming base and emitter metallization by fire-through metallization.

* * * * *